(12) United States Patent
Nagaseki et al.

(10) Patent No.: US 7,023,002 B2
(45) Date of Patent: Apr. 4, 2006

(54) SURFACE TREATING DEVICE AND SURFACE TREATING METHOD

(75) Inventors: Kazuya Nagaseki, Yamanashi (JP); Tadashi Onishi, Yamanashi (JP); Koichi Murakami, Yamanashi (JP); Daisuke Hayashi, Yamanashi (JP); Akiko Kamigori, Yamanashi (JP); Minoru Honda, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/895,039

(22) Filed: Jul. 21, 2004

(65) Prior Publication Data

US 2004/0262540 A1 Dec. 30, 2004

Related U.S. Application Data

(63) Continuation of application No. PCT/JP03/00457, filed on Jan. 21, 2003.

(30) Foreign Application Priority Data

| Jan. 22, 2002 | (JP) | ............... 2002-013412 |
| Jan. 25, 2002 | (JP) | ............... 2002-017404 |
| Feb. 4, 2002 | (JP) | ............... 2002-027147 |
| Nov. 6, 2002 | (JP) | ............... 2002-322182 |

(51) Int. Cl.
*G21G 5/00* (2006.01)
*H01J 37/00* (2006.01)

(52) U.S. Cl. ................. 250/492.1; 250/492.3

(58) Field of Classification Search ............. 250/492.1, 250/492.3, 434; 430/296, 328, 330
See application file for complete search history.

(56) References Cited

U.S. PATENT DOCUMENTS

| 3,553,709 A | * | 1/1971 | Jones | ............... 347/227 |
| 4,954,717 A | * | 9/1990 | Sakamoto et al. | ....... 250/492.3 |
| 5,796,116 A | * | 8/1998 | Nakata et al. | ............... 257/66 |
| 5,909,032 A | * | 6/1999 | Wakalopulos | ............ 250/492.3 |
| 6,087,071 A | * | 7/2000 | Komori | ............... 430/296 |
| 6,197,704 B1 | * | 3/2001 | Endo et al. | ............... 438/781 |
| 6,657,212 B1 | * | 12/2003 | Komori et al. | .......... 250/492.3 |
| 2002/0074519 A1 | * | 6/2002 | Yamaguchi | ............. 250/492.1 |

FOREIGN PATENT DOCUMENTS

| EP | 0 986 072 | 3/2000 |
| EP | 1 215 706 | 6/2002 |
| EP | 1215706 A2 | * 6/2002 |
| JP | 03-260073 | 11/1991 |
| JP | 2002-341100 | 11/2002 |
| WO | WO 96/36070 | 11/1996 |

* cited by examiner

*Primary Examiner*—Nikita Wells
*Assistant Examiner*—Johnnie L. Smith, II
(74) *Attorney, Agent, or Firm*—Oblon, Spivak, McClelland, Maier & Neustadt, P.C.

(57) ABSTRACT

Installed in a vacuum chamber is a mounting table for supporting semiconductor wafer, which is a substrate to be treated, with an electron beam irradiation mechanism mounted on the ceiling of the vacuum chamber for generating electron beams. The mounting table is adapted to be vertically moved by a lifting/lowering device, allowing the distance between the electron beam irradiating mechanism and the semiconductor wafer to be set at a desired value. This makes it possible to perform a uniform satisfactory treatment over the entire surface of the substrate to be treated.

17 Claims, 25 Drawing Sheets

SURFACE TREATING DEVICE AND SURFACE TREATING METHOD

This application is a Continuation Application of PCT International Application No. PCT/JP03/00457 filed on Jan. 21, 2003, which designated the United States.

FIELD OF THE INVENTION

The present invention relates to a surface treating device and a surface treating method for performing a reforming of a resist, an insulating film, or the like, by irradiating electron beams to a subject to be treated, e.g., a semiconductor wafer or a glass substrate, under a vacuum atmosphere.

BACKGROUND OF THE INVENTION

Conventionally, in a field of manufacturing a semiconductor apparatus, transfer of a circuit pattern has been performed on a substrate, e.g., a semiconductor wafer, by employing a lithography process by using a resist. In such a lithography process, a surface treatment using UV has been performed in which the resist is reformed by irradiation of UV after exposure and development and hardened, to thereby enhancing mechanical strength thereof.

Conventionally, therefore, in a field of manufacturing a semiconductor apparatus, there has been employed a surface treating device having a UV irradiation mechanism.

Further, recently, it has been tried to perform a surface treatment for reforming of a resist or an insulation film, by irradiating electrons by using electron beams (EB) instead of UV.

In such a surface treatment using the electrons, the electrons are irradiated to a subject to be treated, e.g., a semiconductor wafer or a glass substrate, which is accommodated in a vacuum chamber under a vacuum atmosphere, to thereby reform the resist or the insulation film. The aforementioned prior art has a characteristic that the treatment can be performed in a very short time. Such a prior art has been disclosed in, e.g., Japanese Patent Laid-open Publication No. 2002-237492.

As mentioned above, it has been tried to perform a surface treatment using electron beams capable of performing the surface treatment in a much shorter time, compared with the case of using UV.

The present inventors have developed a surface treating device described above, and after performing many experimentations, have found that the surface treating device using the electrons has problems, as follows.

It has been found that in the surface treating device using the electrons, while the treatment can be performed in a short time, in-surface uniformity of the treatment becomes deteriorated since in-surface treatment on a substrate to be treated becomes non-uniform due to a non-uniform irradiation state of the electrons starting from the point where the electrons work strongly. In addition, such a problem has been found that accuracy of the treatment becomes worsened since an energy distribution of electrons (electron beams) becomes broad, whereby the electron energy becomes non-uniform.

SUMMARY OF THE INVENTION

It is, therefore, an object of the present invention to provide a surface treating device and a surface treating method using electrons, capable of performing a desired surface treatment on a substrate to be treated uniformly and accurately.

In accordance with one aspect of the present invention, there is provided a surface treating device, including: a vacuum chamber to be set at a specific vacuum atmosphere therein; a mounting table installed in the vacuum chamber, on which a substrate to be treated is mounted; an electron beam irradiation mechanism for irradiating electrons to the substrate to be treated; and a driving device for setting a distance between the mounting table and the electron beam irradiation mechanism at a desired value.

Further, in the surface treating device of the present invention, the driving device may be configured to set the distance between the mounting table and the electron beam irradiation mechanism at the desired value by vertically moving the mounting table.

In accordance with another aspect of the present invention, there is provided a surface treating device, including: a vacuum chamber to be set at a specific vacuum atmosphere therein; a mounting table installed in the vacuum chamber, on which a substrate to be treated is mounted; an electron beam irradiation mechanism for irradiating electrons to the substrate to be treated; and an electron path control unit for controlling a path of the electrons irradiated from the electron beam irradiation mechanism.

Further, in the surface treating device of the present invention, the electron path control unit may have an electron path deflecting member and control the path of the electrons by a potential of the electron path deflecting member.

Still further, the surface treating device of the present invention may include a potential control unit for controlling the potential of the electron path deflecting member.

Still further, in the surface treating device of the present invention, the potential control unit may be formed of a variable resister installed between the electron path deflecting member and a ground potential.

Still further, in the surface treating device of the present invention, the potential control unit may be formed of a variable DC power supply for applying a DC current to the electron path deflecting member.

Still further, in the surface treating device of the present invention, the electron path deflecting member may be formed of a magnetic field forming unit.

Still further, in the surface treating device of the present invention, the magnetic field forming unit may be configured to generate a multipole magnetic field along a sidewall of the vacuum chamber to surround the substrate mounted on the mounting table.

Still further, in the surface treating device of the present invention, the magnetic field forming unit may be configured to rotate around the vacuum chamber to make the multipole magnetic field rotate.

Still further, in the surface treating device of the present invention, the magnetic field forming unit may be configured to generate a magnetic field in a direction normal to a surface of the substrate mounted on the mounting table.

In accordance with still another aspect of the present invention, there is provided a surface treating device, including: a vacuum chamber to be set at a specific vacuum atmosphere therein; a mounting table installed in the vacuum chamber, on which a substrate to be treated is mounted; an electron beam irradiation mechanism for irradiating electrons to the substrate to be treated, the electron beam irradiation mechanism having an irradiation window for airtightly partitioning an inside of the electron beam irradiation mechanism from an inside of the vacuum chamber; and a pressure control mechanism for controlling an inner pressure of the vacuum chamber to thereby control a state of the electrons irradiated to the substrate to be treated from the electron beam irradiation mechanism.

Further, in the surface treating device of the present invention, the inner pressure of the vacuum chamber may be allowed to be set in the range from 0.0133 KPa to 66.5 KPa by the pressure control mechanism.

Still Further, the surface treating device of the present invention may include a detector for detecting an amount of the electrons irradiated from the electron beam irradiation mechanism and a controller for controlling the amount of the electrons from the electron beam irradiation mechanism, based on a detection result from the detector.

Still further, in the surface treating device of the present invention, a surface reforming may be performed on the substrate to be treated by an electron irradiation from the electron beam irradiation mechanism.

In accordance with still another aspect of the present invention, there is provided a surface treating method, including the steps of: placing a substrate to be treated in a vacuum chamber; and performing a surface treatment by irradiating electrons to the substrate to be treated from an electron beam irradiation mechanism, wherein, by using the electron beam irradiation mechanism having an irradiation window for airtightly partitioning an inside thereof from that of the vacuum chamber, an inner pressure of the vacuum chamber is adjusted to control a state of the electrons irradiated from the electron beam irradiation mechanism to the substrate to be treated.

Further, in the surface treating method of the present invention, the inner pressure of the vacuum chamber may be controlled to be set in the range from 0.0133 KPa to 66.5 KPa.

In accordance with still another aspect of the present invention, there is provided a surface treating device, including: a vacuum chamber to be set at a specific vacuum atmosphere therein; a mounting table installed in the vacuum chamber, on which a substrate to be treated is mounted; an electron beam irradiation mechanism for irradiating electrons to the substrate to be treated; and an energy control mechanism for irradiating the electrons to the substrate to be treated by controlling energies of electrons irradiated from the electron beam irradiation mechanism.

Further, in the surface treating device of the present invention, the energy control mechanism may control the energies of the electrons by generating an electric field.

Still further, in the surface treating device of the present invention, the energy control mechanism may have an electrode installed in the mounting table.

Still further, in the surface treating device of the present invention, the energy control mechanism may have a voltage applying unit for applying a desired voltage to the electrode.

Still further, in the surface treating device of the present invention, the energy control mechanism may have a meshed or perforated middle electrode installed between the mounting table and the electron beam irradiation mechanism.

Still further, in the surface treating device of the present invention, the energy control mechanism may have a voltage applying unit for applying a desired voltage to the middle electrode.

Still further, in the surface treating device of the present invention, the energy control mechanism may be configured to control the energies of electrons irradiated from the electron beam irradiation mechanism to be lowered.

Still further, in the surface treating device of the present invention, the electron beam irradiation mechanism may be configured to irradiate electrons into the vacuum chamber through an irradiation window having a specific thickness.

Still further, in the surface treating device of the present invention, the energy control mechanism may function to filter electron energies such that electrons of other than desired energies are removed from electrons emitted from the electron beam irradiation mechanism.

BRIEF DESCRIPTION OF THE DRAWINGS

The above and other objects and features of the present invention will become apparent from the following description of preferred embodiments, given in conjunction with the accompanying drawings, in which.

DETAILED DESCRIPTION OF THE PREFERRED EMBODIMENT

Figure 1:
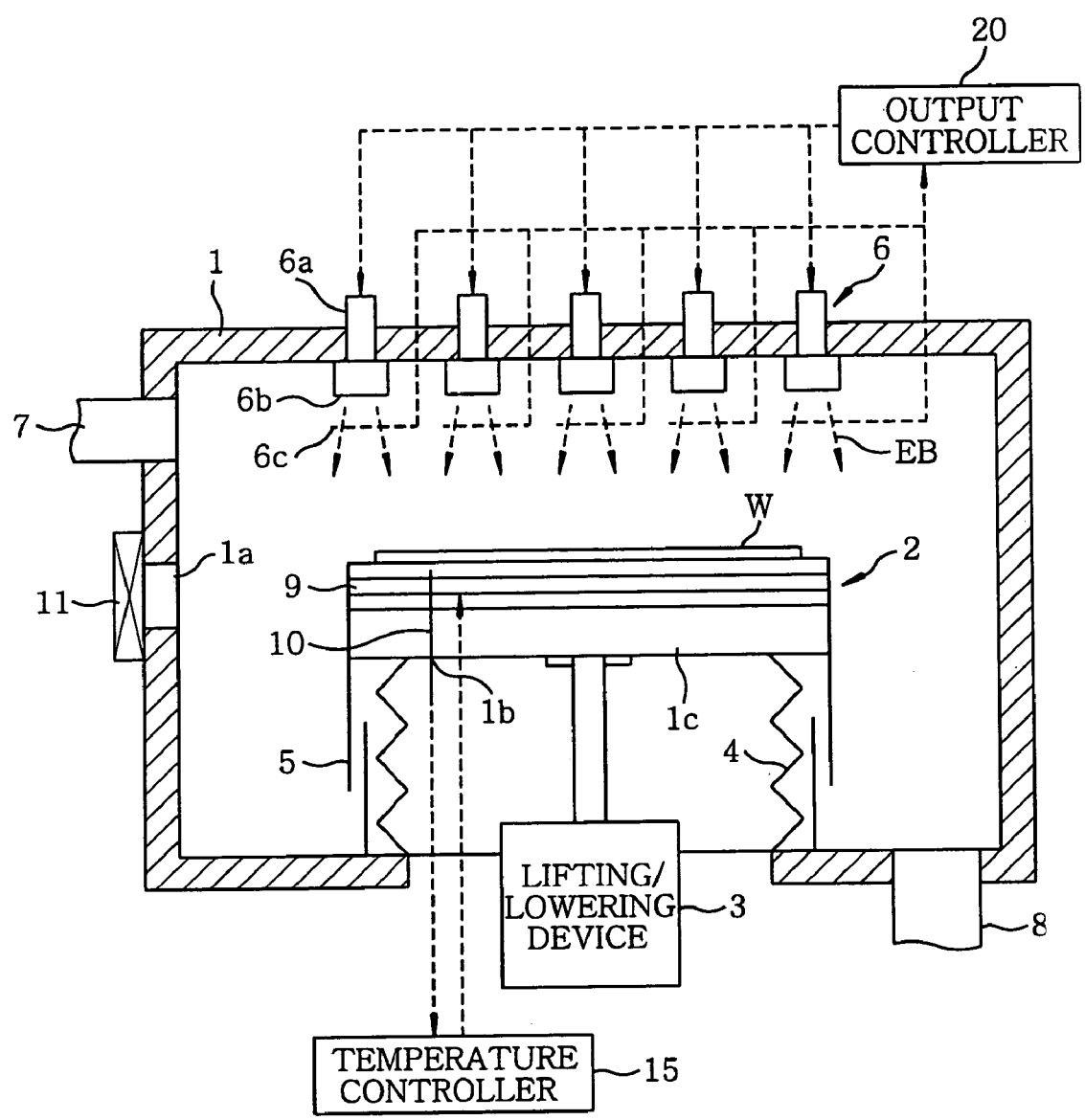
FIG. 1 offers a schematic configuration in accordance with a preferred embodiment of a surface treating device of the present invention.

Hereinafter, preferred embodiments of the present invention will be described in detail with reference to the accompanying drawings. FIG. 1 typically shows a schematic configuration of a preferred embodiment, in which the present invention is applied to a surface treating device for performing a surface treatment (surface reforming processing) on, e.g., an insulation film (for example, Low-K film), a resist, and the like, by irradiating electrons (electron beams (EB)) to a semiconductor wafer, and the like. In the same drawings, reference number 1 describes a cylindrical vacuum chamber made of, e.g., aluminum. An inside of the vacuum chamber can be airtightly blocked and forms a treatment chamber.

Inside the vacuum chamber 1, there is installed a mounting table 2 for substantially horizontally supporting a semiconductor wafer W as a substrate to be treated whose surface to be treated faces upward.

The mounting table 2 is formed to vertically move up and down by a lifting/lowering device 3 made of a ball screw, a motor for rotating the ball screw, and the like. In a lower side of the mounting table 2, there is installed a cylindrical bellows 4 made of, e.g., stainless steel (SUS), which is expansible and contractible and airtightly maintains the inside of the vacuum chamber 1. In addition, a bellows cover 5 is installed outside the bellows 4.

Meanwhile, an electron beam irradiation mechanism 6 for generating electron beams (EB) is installed in a ceiling of the vacuum chamber 1, and formed to irradiate the electron beams (EB) to the semiconductor wafer W mounted on the mounting table 2. The electron beams (EB) emitted from an EB tube 6a of the electron beam irradiation mechanism 6 collide with gas molecules in a processing space inside the vacuum chamber 1 and are diffused, repeatedly, to thereby become somewhat diffused radial shaped-electron flows, as shown in FIG. 1. In the preferred embodiment, the term "electron beam (EB)" refers to such an electron flow. Further, a distance between the electron beam irradiation mechanism 6 and the semiconductor wafer W, while the electron beams (EB) being irradiated, can be controlled, by vertically moving the mounting table 2 by the lifting/lowering device 3. In the preferred embodiment, the mounting table 2 is configured to move up and down vertically. However, it can be configured such that the mounting table 2 is fixed and instead, the electron beam irradiation mechanism 6 is vertically moved, or both of them are vertically moved.

Figure 2:
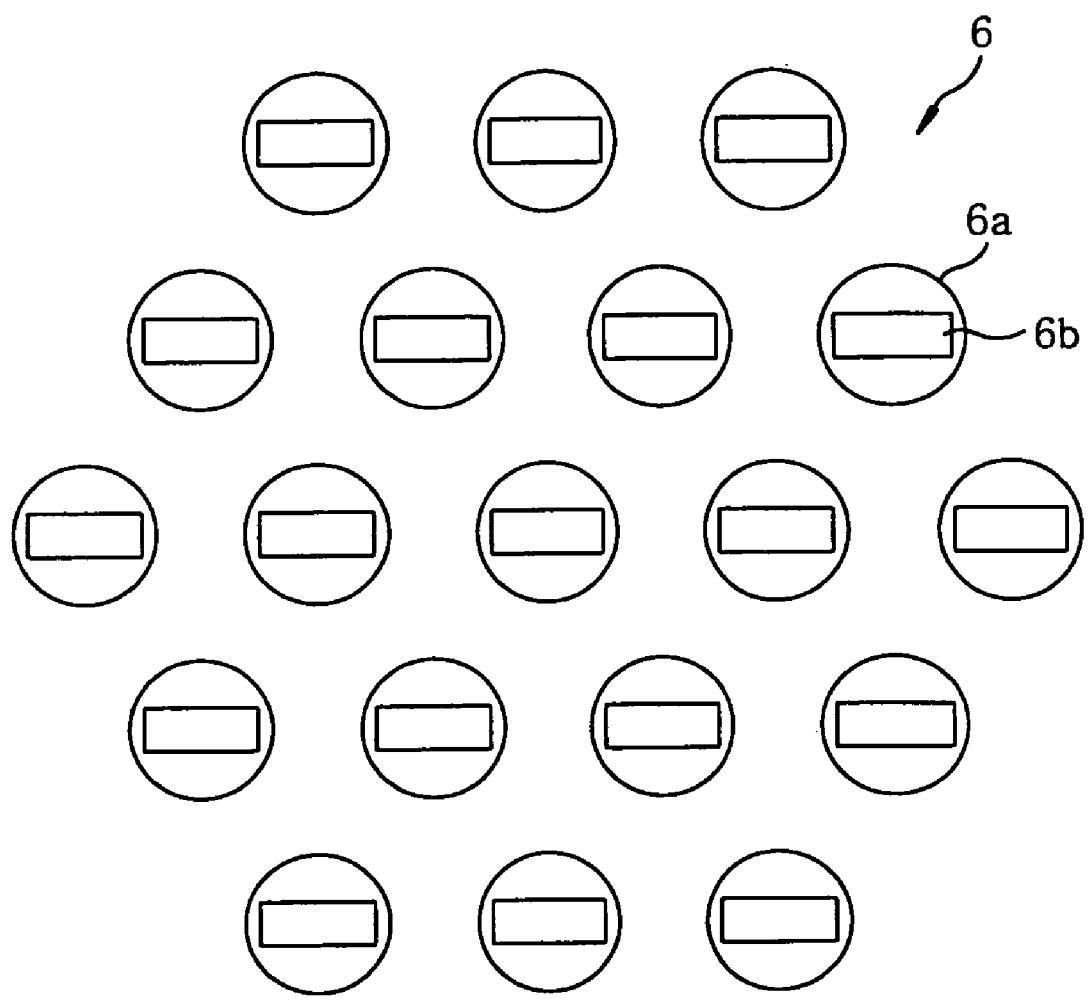
FIG. 2 shows a schematic configuration of a main part in the surface treating device of FIG. 1.

The electron beam irradiation mechanism 6 is formed by arranging a plurality of EB tubes 6a. In the preferred embodiment, a total of nineteen EB tubes 6a are arranged to occupy a circular area having a substantially same shape as the semiconductor wafer W mounted on the mounting table 2, as shown in FIG. 2. In addition, reference number 6b in FIG. 2 describes a window (irradiation window) airtightly blocking an inside of the EB tube 6a from an outside, and, at the same time, formed to emit the electron beams (EB). The irradiation window 6b is made of, e.g., SiN having a thickness in a range from about 1 to 3 μm.

As shown in FIG. 1, the EB tube 6a is disposed such that an end portion thereof (window 6b side) where the electron beams EB are emitted faces downward. In addition, the electron beams (EB) are formed to be emitted toward the semiconductor wafer W inside the vacuum chamber 1 through the window 6b.

Further, inside the vacuum chamber 1, there is installed a grid shaped detector 6c for detecting the amount of the electron beams EB, for each EB tube 6a.

The detector 6c detects the amount of the electron beams (EB) from currents caused by collisions of the electron beams. (EB). Each detection signal of the detector 6c is inputted to an output controller 20. The output controller 20 electrically controls each of the EB tubes 6a based on the detection signal as a reference signal such that each EB tube 6a outputs a predetermined amount of electron beams (EB).

Further, as shown in FIG. 1, there are installed a gas inlet line 7 coupled to a gas supply source (not shown) and a gas exhaust line 8 coupled to a vacuum exhaust device (not shown), in the vacuum chamber 1. The inside of the vacuum chamber 1 is made to be in a predetermined gas atmosphere maintained at a specific vacuum level.

Still further, there are installed a heater 9 for heating the semiconductor wafer W to a predetermined temperature on a mounting surface of the mounting table 2 and, at the same time, a temperature detector 10 for detecting a heating temperature by the heater 9 inside the mounting table 2. In addition, a temperature detection signal by the temperature detector 10 is inputted to a temperature controller 15 which adjusts a power supplied to the heater 9 by comparing the temperature detection signal and a predetermined desired temperature. As a result, the heater 9 is thermally controlled such that it is maintained at a predetermined desired temperature.

Still further, on a sidewall of the vacuum chamber 1, there is formed an opening 1a for loading and unloading the semiconductor wafer W, and, at the same time, a gate valve 11 is installed in the opening 1a. In addition, when loading and unloading the wafer W, the gate valve 11 is opened and closed to perform loading/unloading of the semiconductor wafer W into/from the opening 1a.

Next, a performing order of processes for a surface treatment on an insulation film, a photo resist, or the like, which is formed on the semiconductor wafer W, by the surface treating device described above will be explained.

First, the gate valve 11 installed on the sidewall of the vacuum chamber 1 is opened to load the semiconductor wafer W into the vacuum chamber 1 from the opening 1a by using, e.g., a transfer mechanism (not shown). As a result, the semiconductor wafer W is mounted on the mounting table 2 that is lowered to a predetermined position in advance.

Subsequently, the transfer mechanism is retreated to the outside of the vacuum chamber 1, and then, the gate valve 11 is closed to airtightly block the inside of the vacuum chamber 1.

Thereafter, the mounting table 2 is elevated to a desired position, as shown in FIG. 1, so as to set the distance between the semiconductor wafer W and the electron beam irradiation mechanism 6 at a desired value. In other words, as shown in FIG. 3, the electron beams (EB) emitted from each EB tube 6a of the electron beam irradiation mechanism 6 are gradually diffused radially after being emitted.

Figure 3A:
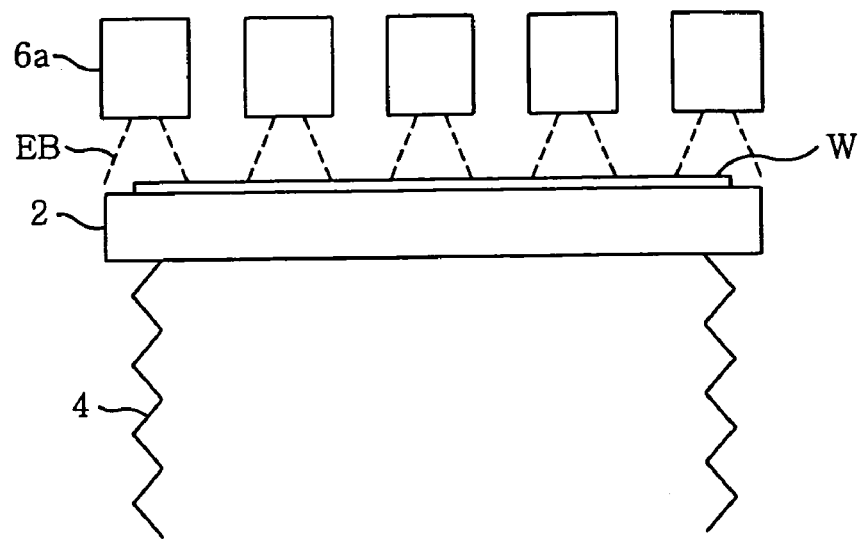
FIG. 3 explains a variation of an irradiation condition of electron beams in the surface treating device of FIG. 1.
Figure 3B:
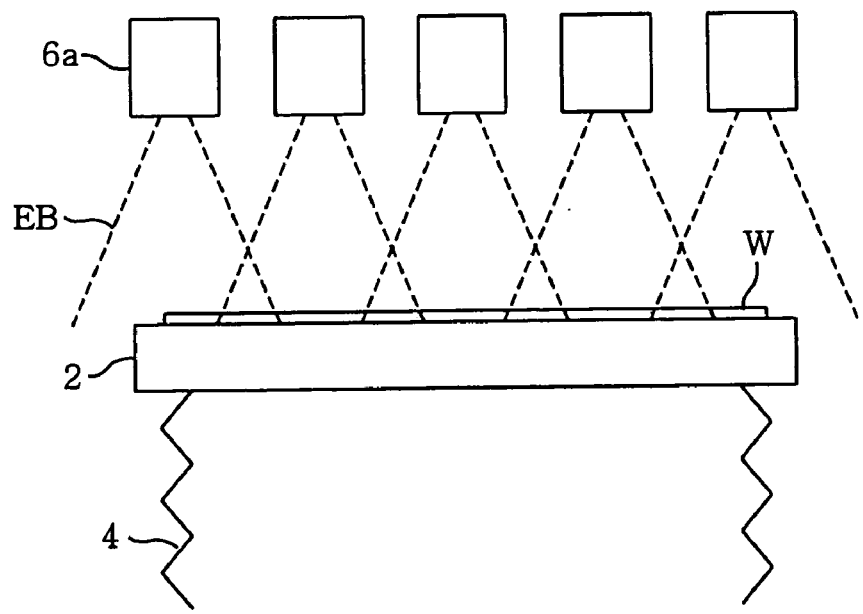

Thus, the state of the electron beams (EB) to be irradiated onto the surface of the semiconductor wafer W is changed in both cases, for example: as shown in FIG. 3A, the electron beam irradiation mechanism 6 approaches to the semiconductor wafer W; and as shown in FIG. 3B, the electron beam irradiation mechanism 6 is moved away from the semiconductor wafer W. That is, if the semiconductor wafer W is moved away from the electron beam irradiation mechanism 6, the electron beams (EB) emitted from one EB tube 6a become irradiated to a wider area of the semiconductor wafer W.

Therefore, in the preferred embodiment, the mounting table 2 is vertically moved up and down by the lifting/lowering device 3 to thereby adjust the distance between the electron beam irradiation mechanism 6 and the semiconductor wafer W such that the electron beams can be uniformly irradiated over an entire surface of the semiconductor wafer W.

Further, in the vacuum chamber 1, the electron beams (EB) act on an atmosphere gas, so that a plasma is generated. Such a plasma shows a tendency that a density thereof is high in an upper part inside the vacuum chamber 1 that is close to the electron beam irradiation mechanism 6 and low in a lower part. Therefore, by vertically moving the mounting table 2, the distance between the part where plasma density is high and the semiconductor wafer W can be further increased or decreased. For example, in order to avoid an action of the plasma on the semiconductor wafer W, the mounting table 2 can be lowered to make the semiconductor wafer W move away from the plasma. On the other hand, in order to employ an action of plasma on the treatment of the semiconductor wafer W, the mounting table 2 may be elevated to make the semiconductor wafer W approach the plasma closely.

As described above, after setting the distance between the electron beam irradiation mechanism 6 and the semiconductor wafer W at a desired value, the inside of the vacuum chamber 1 is exhausted through the gas exhaust line 8, and, at the same time, a predetermined atmosphere gas, e.g., nitrogen gas, is introduced through the gas inlet line 7. As a result, the vacuum chamber 1 is maintained at a specific inner pressure, e.g., in the range from about 0.0133 to 66.5 KPa (0.01 to 500 Torr).

Then, the electron beams (EB) are irradiated to the semiconductor wafer W from the EB tube 6a, while heating the semiconductor wafer W to a desired temperature by the heater 9, whereby a surface treatment is performed on an insulation film formed on the semiconductor wafer W.

Further, if an irradiating time of the electron beams (EB) to the semiconductor wafer W reaches a predetermined time, the irradiation of the electron beams (EB) by the EB tube 6a is stopped to finish the surface treatment, and then, the semiconductor wafer W is unloaded from the vacuum chamber 1, in a reversed order of the aforementioned order.

Figure 4:
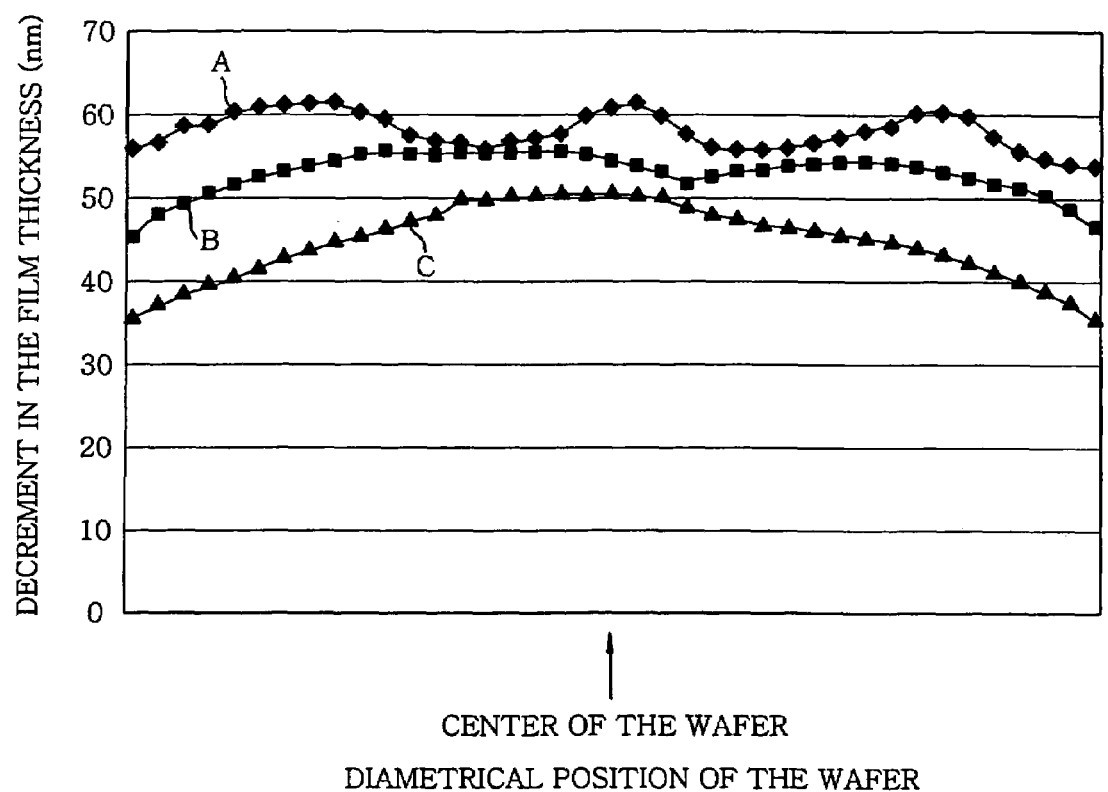
FIG. 4 sets forth results of a surface treatment by the surface treating device of FIG. 1.

FIG. 4 shows a variation of in-surface uniformity of a treatment, in case where a surface treatment is performed by using the surface treating device described above on a resist formed on a semiconductor wafer W having a diameter of 8 inch, while varying the distance (gap) between the electron beam irradiation mechanism 6 and the semiconductor wafer W.

In the same drawing, a vertical axis indicates a decrement in a resist film thickness [(film thickness before irradiating electron beams (EB))–(film thickness after irradiating electron beams (EB))], and a horizontal axis indicates a diametrical position of the semiconductor wafer W (a center of the horizontal axis coincides with that of the semiconductor wafer). Curves A, B, and C correspond to the cases where the gap is 30 mm, 58 mm, and 100 mm, respectively. In addition, such a decrement in the film thickness describes a degree of reforming in the resist before and after irradiating the electron beams (EB), and the in-surface uniformity thereof shows that of the EB cure treatment.

Further, treatment conditions are as follows: 1.33 KPa (10 Torr) in a pressure; 250 μA in a tube current of the EB tube 6a; and 330 seconds in an irradiating time.

As shown in FIG. 4, in case where a gap is 30 mm, a treatment in a part directly under the EB tube 6a is much further advanced as compared with those in other parts, so that the in-surface uniformity becomes deteriorated. Further, as the gap is widened to 58 mm and 100 mm, a difference of the treatment between the part directly under the EB tube 6a and other parts tends to be decreased gradually. However, a difference of the treatment becomes distinguished between a central and a circumferential part of the semiconductor wafer W, so that the treatment in the circumferential part tends to be degraded. Therefore, in such treatment conditions, it is preferable that the gap is set to be about 58 mm.

As mentioned above, in the aforementioned preferred embodiment, if the gap becomes wide, a difference of the treatment between a central and a circumferential part of the semiconductor wafer W tends to be distinguished. The reason is considered that the amount of irradiation of electron beams (EB) decreases around the circumferential part of the semiconductor wafer W.

Figure 5:
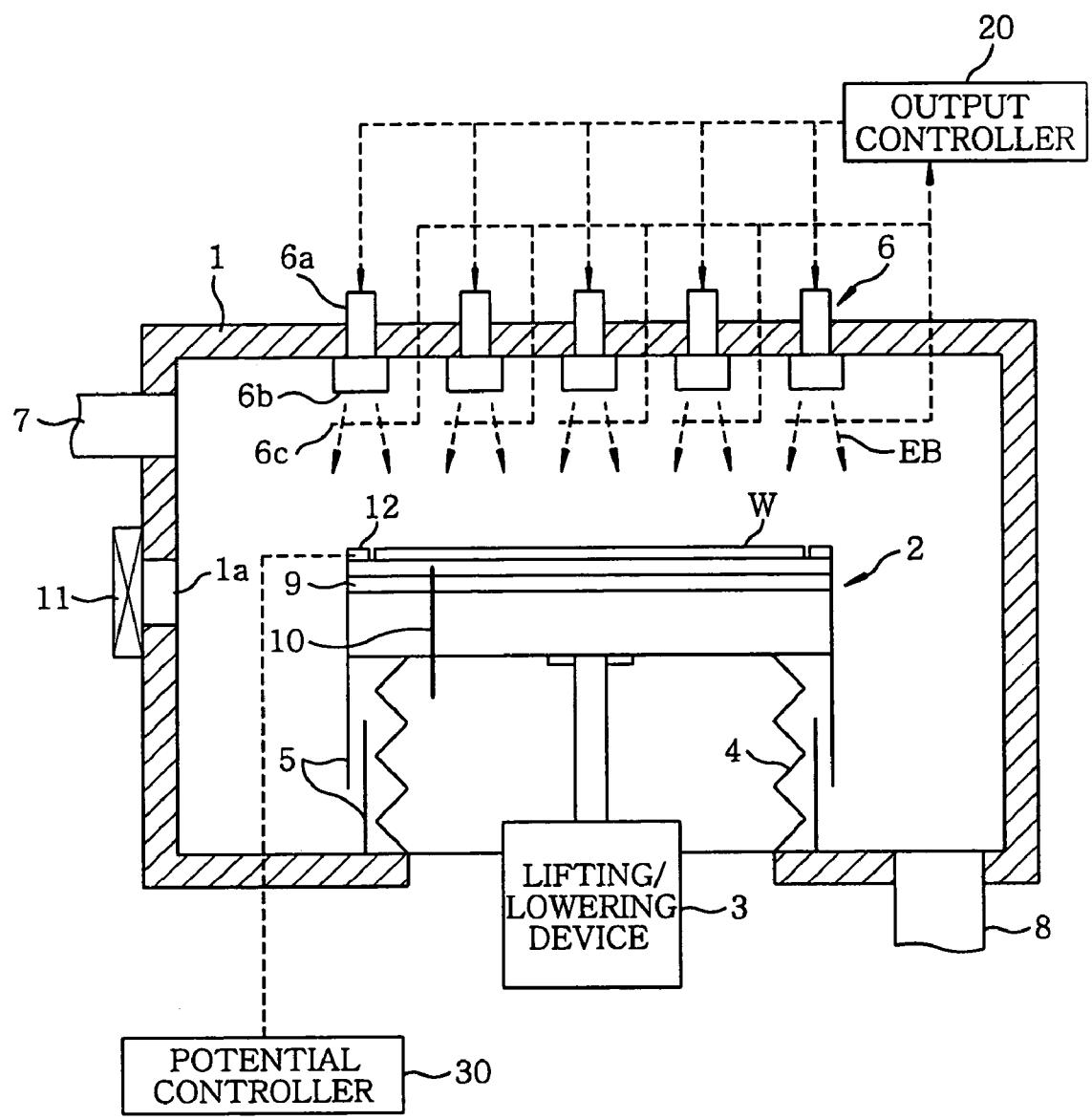
FIG. 5 presents a schematic configuration in accordance with another preferred embodiment of a surface treating device of the present invention.

FIG. 5 describes a schematic configuration in accordance with another preferred embodiment of the present invention which is capable of controlling the amount of irradiation of electron beams (EB) in the circumferential part of the semiconductor wafer W mentioned above. In this preferred embodiment, the amount of irradiation of electron beams (EB) is controlled in the circumferential part of the semiconductor wafer W mainly by controlling an electron beam (EB) path.

In other words, in this preferred embodiment, there is installed on the mounting table 2 a ring-shaped member 12 made of a conductive material such as stainless, aluminum, silicon, silicon carbide (SiC), and the like, so as to be placed around the semiconductor wafer W, as shown in FIG. 5. In addition, there is installed between the ring-shaped member 12 and a ground potential a potential controller 30 for adjusting a charge condition of the ring-shaped member 12 to control a potential thereof.

Figure 6:
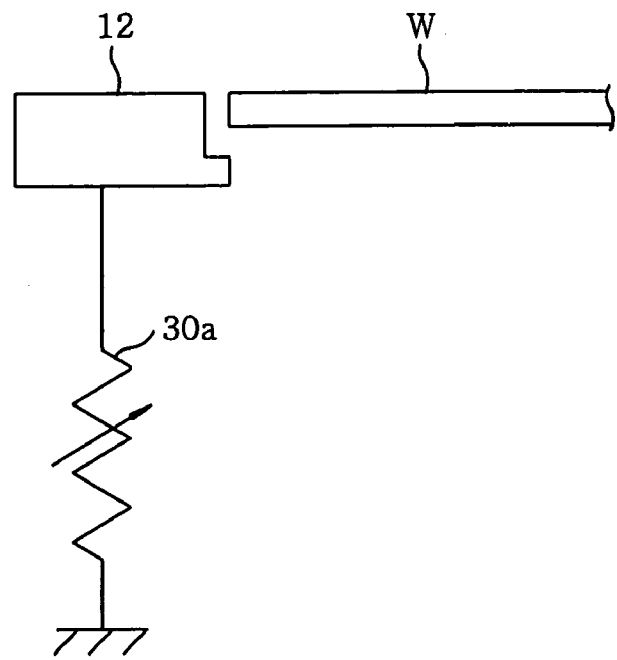
FIG. 6 provides a schematic configuration of a main part in the surface treating device of FIG. 5.
Figure 7:
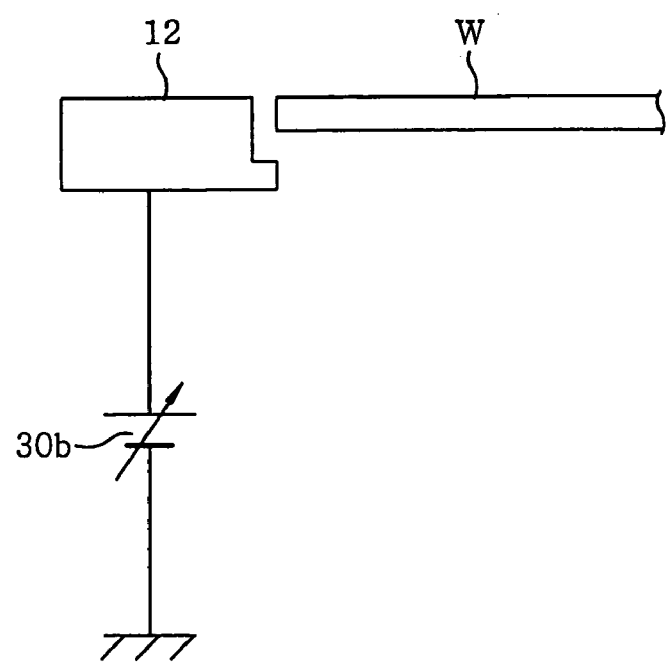
FIG. 7 describes a schematic configuration of a main part in the surface treating device of FIG. 5.

The potential controller 30 may be formed with a variable resister 30a for controlling currents running between the ring-shaped member 12 and the ground potential, as shown in FIG. 6, and a variable DC power supply 30b for supplying a DC voltage to the ring-shaped member 12, as shown in FIG. 7, or the like. Instead of installing the potential controller 30, by selecting an insulating material such as quartz, ceramic, or the like, as a material of the ring-shaped member 12, the electron beam (EB) path may be controlled to be in a desired state by making a charging potential of the ring-shaped member 12 have a desired potential.

In the aforementioned preferred embodiment, by setting the potential of the ring-shaped member 12 to, e.g., a constant positive potential with respect to the semiconductor wafer W by the potential controller 30 or the like, a path of electron beam (EB) emitted toward the central part of the semiconductor wafer W may be deflected in the direction of the circumferential part of the semiconductor wafer W. Accordingly, it is possible to reduce the amount of electron beams (EB) in the central part of the semiconductor wafer W and increase that in the circumferential part.

Therefore, it is possible to suppress declining of the in-surface uniformity of the treatment, that is, it is possible to prevent a treatment in the central part from advancing further than that in the circumferential of the semiconductor wafer W as shown in the aforementioned curves B and C of FIG. 4.

Meanwhile, the electron beam (EB) path may be controlled by using a magnetic field instead of using a potential as described above.

Figure 8:
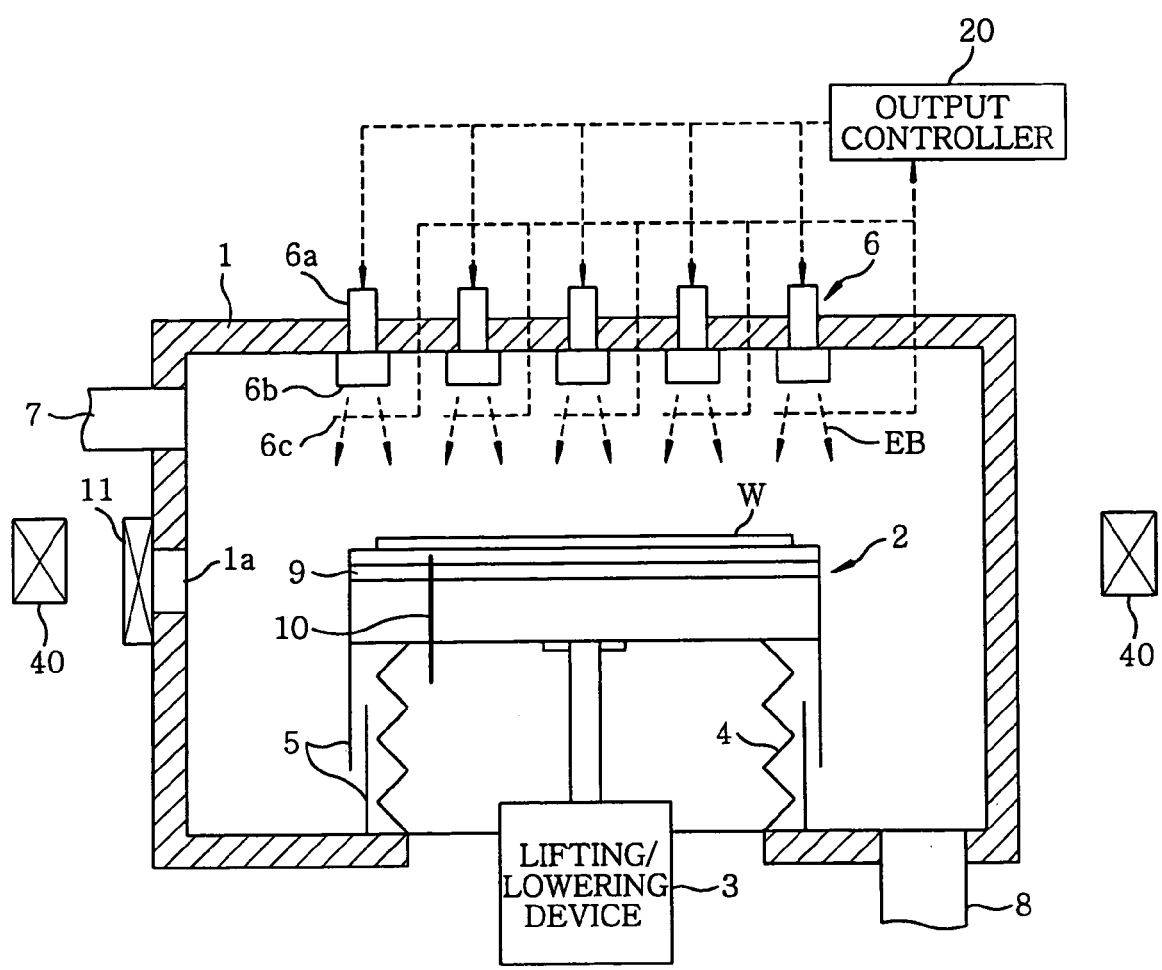
FIG. 8 depicts a schematic configuration in accordance with still another preferred embodiment of a surface treating device of the present invention.
Figure 9:
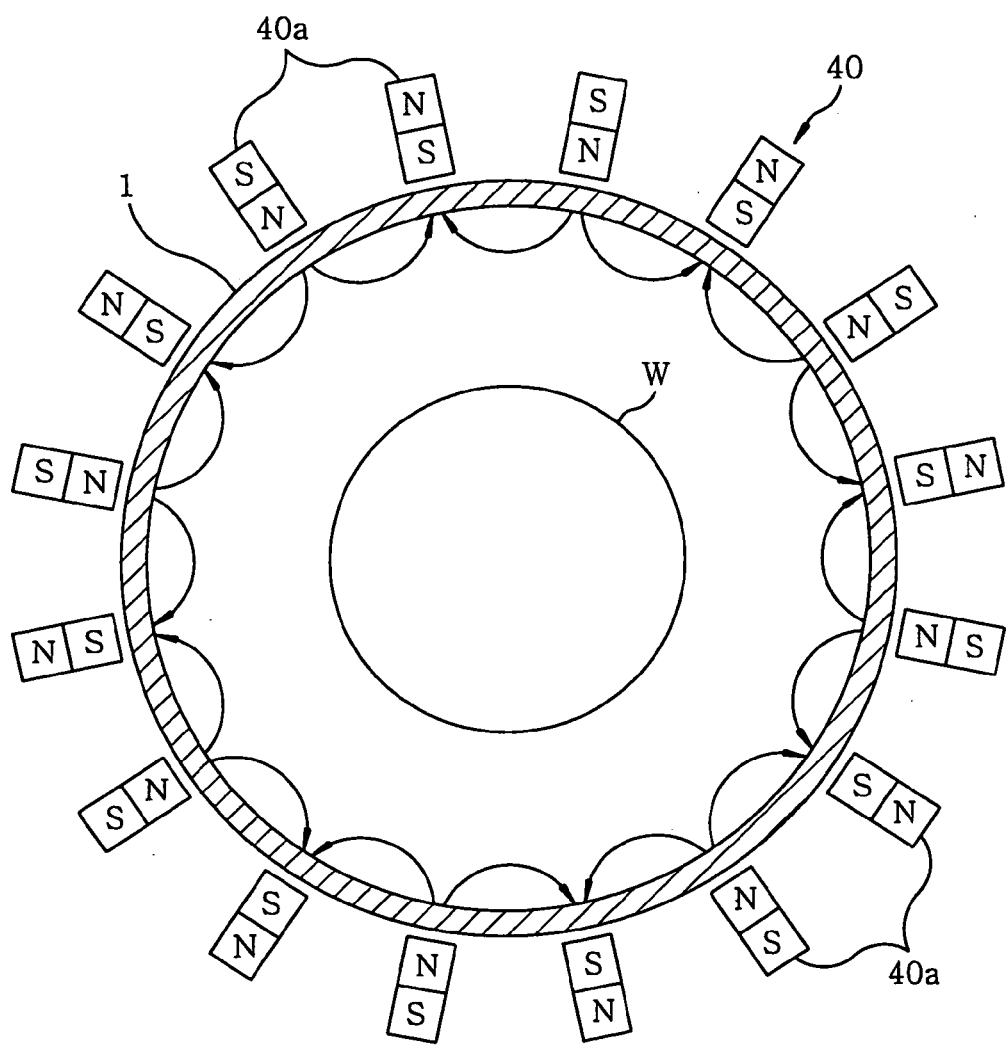
FIG. 9 describes a schematic configuration of a main part in the surface treating device of FIG. 8.

FIGS. 8 and 9 show schematic configurations of another preferred embodiment, in which the electron beam (EB) path is controlled by a magnetic field. In this preferred embodiment, a so-called multipole magnetic field is formed by a magnet 40 installed so as to surround the vacuum chamber 1.

In other words, as shown in FIG. 9, the magnet 40 is formed of a plurality of magnet segments 40a, and the magnet segments 40a are formed so that neighboring magnetic poles toward inner sides (vacuum chamber 1 side) of the magnet segments 40a are arranged such that N poles and S poles are alternately arranged.

By such an arrangement of the magnetic pole, the multipole magnetic field indicated as an arrow in the same drawing is formed along the inner wall of the vacuum chamber 1. In addition, the entire magnets 40 are formed to be rotated around the vacuum chamber 1, whereby the multipole magnetic field is formed to be rotated, accordingly.

In accordance with this preferred embodiment, the electron beam (EB) path is made to be deflected toward the circumferential direction of the semiconductor wafer W by the multipole magnetic field, so that the same operation and effect as the aforementioned preferred embodiment could be obtained.

Further, in this preferred embodiment, it has been explained that the electron beam (EB) path is controlled by the multipole magnetic field formed along the inner wall of the vacuum chamber 1, but it is not limited thereto and the electron beam (EB) path may be controlled by another type of magnetic field.

Figure 10:
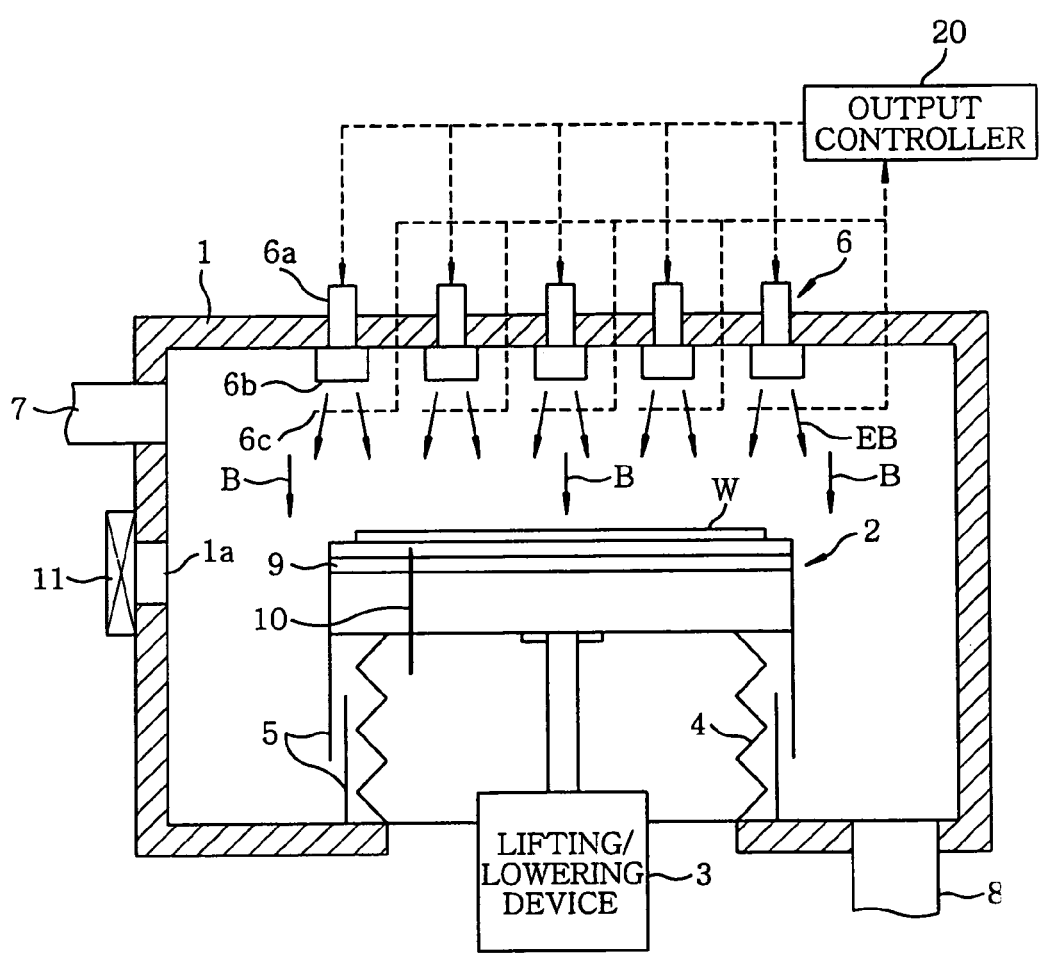
FIG. 10 offers a schematic configuration in accordance with still another preferred embodiment of a surface treating device of the present invention.

For example, as indicated by arrows in FIG. 10, magnetic fields (B) are generated in a vertical direction inside the vacuum chamber 1, and the electron beam (EB) path may be controlled in such a direction that diffusion thereof is suppressed by the magnetic field (B) formed along the vertical direction.

Meanwhile, in the aforementioned preferred embodiment, the EB tube 6a forming the electron beam irradiation mechanism 6 has the window (irradiation window) 6b and the insides of the EB tube 6a and the vacuum chamber 1 are airtightly partitioned by the window 6b. As a result, an inner pressure of the vacuum chamber 1 can be controlled independently of that of the EB tube 6a.

In case of employing the aforementioned configuration, it is possible to increase the inner pressure of the vacuum chamber to some degree, as compared with the case where there is no irradiation window of a partition described above and an arrangement part where, e.g., a filament for generating electron beams (EB) and the like are installed is connected with an inside of the vacuum chamber. That is, in the case of no irradiation window of a partition, if the inner pressure of the vacuum chamber increases, a pressure of the arrangement part where, e.g., the filament for generating electron beams (EB) and the like are installed increases, and thus generating a plasma undesired in this part. Thus, it is necessary to maintain the inner pressure of the vacuum chamber 1 at a high vacuum. Contrary to this, in accordance with the aforementioned preferred embodiment, it is not necessary to maintain the inner pressure of the vacuum chamber 1 at a high vacuum, since the inner pressure of the vacuum chamber 1 can be adjusted independently of that of the EB tube 6a.

Therefore, the number of gas molecules inside the vacuum chamber 1 can be changed by controlling the inner pressure of the vacuum chamber 1 which in turn will change the collision probability for electrons with gas molecules, whereby the state of the electron beam (EB) (electron energy and diffusion state) which is irradiated to the semiconductor wafer W can be controlled.

Figure 11:
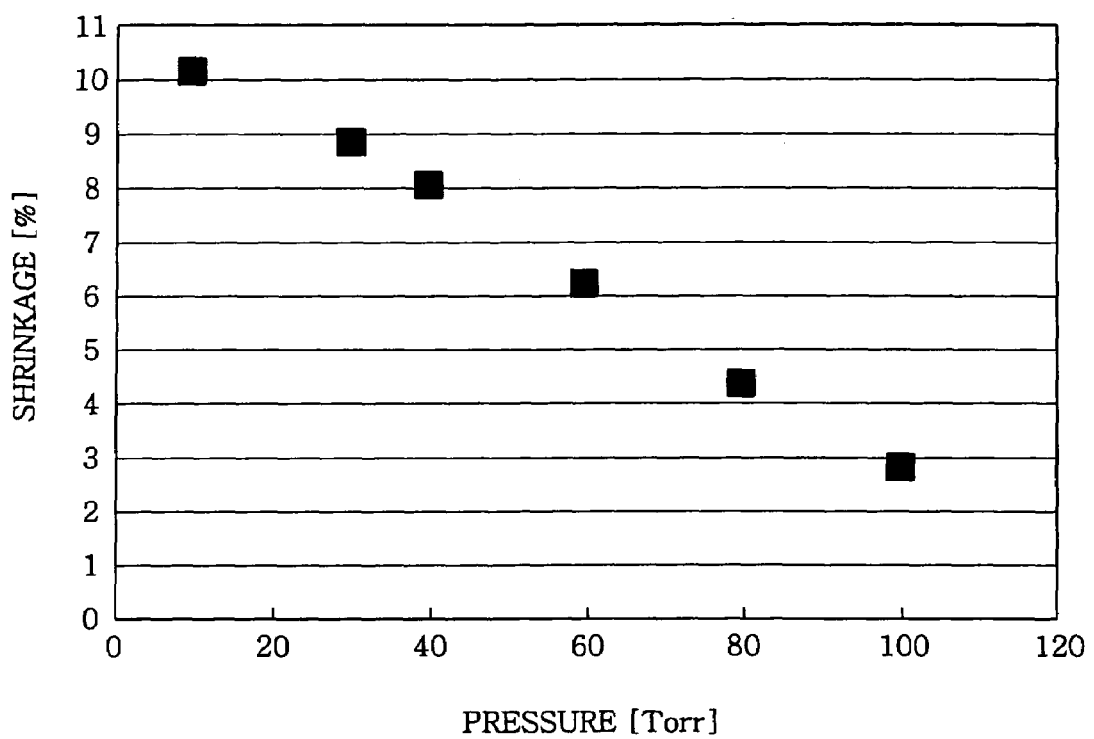
FIG. 11 shows a relation between an inner pressure of a vacuum chamber and shrinkage.

FIG. 11 shows results for performing a reforming of a resist film formed on the semiconductor wafer W, wherein a vertical axis indicates shrinkage [amount of shrink (decrement) after irradiating electron beams/film thickness before irradiating electron beam (%)] and a horizontal axis indicates an inner pressure of the vacuum chamber 1.

Figure 12:
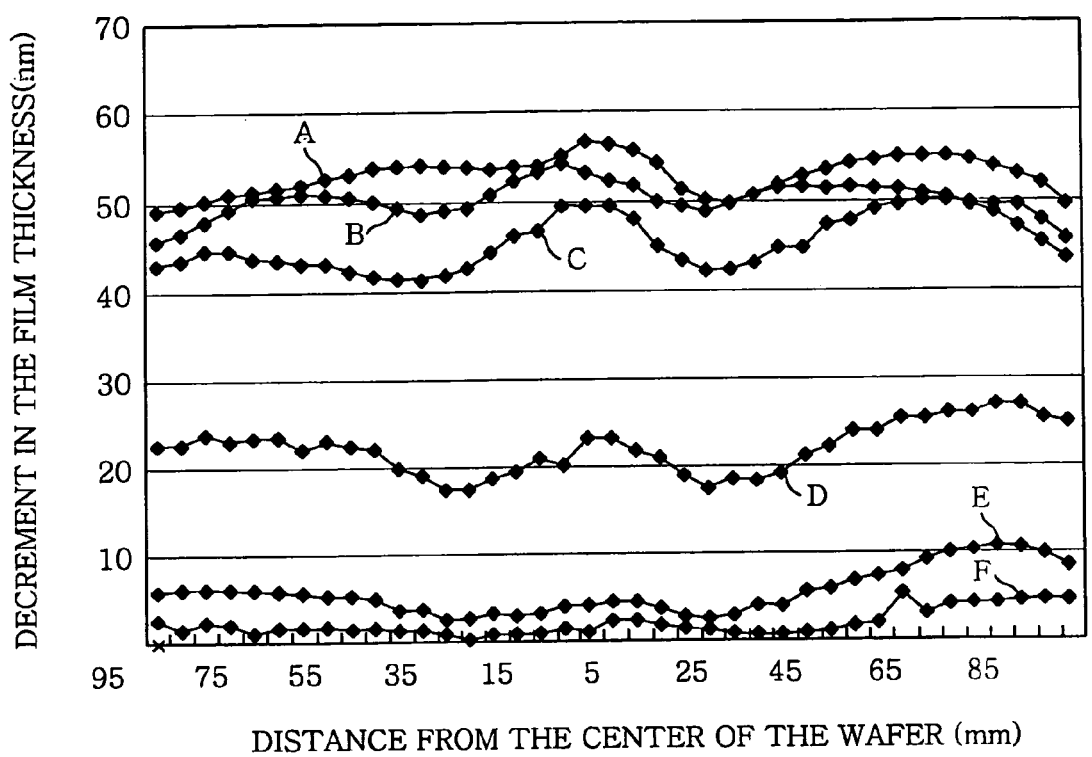
FIG. 12 depicts a relation between a decrement of a resist film thickness in each part of a wafer and an inner pressure of a vacuum chamber.

Further, in FIG. 12, a vertical axis describes a decrement in a film thickness of a resist [(film thickness before irradiating electron beams (EB))–(film thickness after irradiating electron beams (EB))], and a horizontal axis describes the distance from a center of the semiconductor wafer W [diametrical position (a center of the horizontal axis coincides with that of the semiconductor wafer)], wherein curves A, B, C, D, E and F correspond to cases in which the inner pressures in the vacuum chamber 1 are 1.33 KPa (10 Torr), 2.66 KPa (20 Torr), 3.99 KPa (30 Torr), 6.65 KPa (50 Torr), 9.31 KPa (70 Torr), and 13.3 KPa (100 Torr), respectively.

As described in the drawings, if the inner pressure of the vacuum chamber 1 increases, a decrement (shrinkage) of the resist film formed on the semiconductor wafer W decreases. The reason is that if the inner pressure of the vacuum chamber 1 increases to thereby increase the number of gas molecules inside the vacuum chamber 1, the probability that an electron in the electron beams (EB) irradiated from the electron beam irradiation mechanism 6 collides with gas molecules increases, whereby the electron loses its energy and is diffused, simultaneously.

Accordingly, it is possible to control the state (the electron energy and diffusion state) of the electron beam (EB) irradiated to the semiconductor wafer W by adjusting the inner pressure of the vacuum chamber 1, similar to the case of varying the distance (gap) between the aforementioned electron beam irradiation mechanism 6 and the semiconductor wafer W.

Further, if the number of gas molecules is too small, a control effect of the electron beam (EB) decreases. On the other hand, if the number of gas molecules is too big, energy loss becomes large, resulting in deterioration of efficiency. Therefore, it is preferable that a control range of a pressure is in the range from about 0.0133 to 66.5 KPa (0.01 to 500 Torr), for example.

Still further, it is possible to control the state (the electron energy and diffusion state) of the electron beams (EB) irradiated to the semiconductor wafer W by changing not only the inner pressure of the vacuum chamber 1, as described above, but also the kind of gas introduced into the vacuum chamber 1. In this case, it is preferable that the kind of gas being used is an inert gas, and helium, argon, nitrogen, and the like may be used, for example. As required, $O_2$, $H_2$, methane, and the like may be added to the inert gases.

As described above, in accordance with each preferred embodiment, in-surface uniformity can be improved in the semiconductor wafer for a surface treatment, whereby it is possible to uniformly perform an excellent surface treatment over the entire surface of the semiconductor wafer W.

Meanwhile, in each preferred embodiment described above, the inside of the EB tube 6a is maintained at a high vacuum, so that the irradiation window 6b is required to have mechanical strength capable of enduring a pressure difference between the inside and the outside of the EB tube 6a, and to airtightly block the inside of the EB tube 6a from the outside thereof.

For this, there has been employed a member for forming the irradiation window 6b having a thickness about, e.g., 3 μm, and, as a material thereof, SiN, or the like has been employed.

Therefore, in order to extract the electron beams (EB) through the irradiation window 6b mentioned above, a somewhat high acceleration voltage is needed as an acceleration voltage of electron in the EB tube 6a. For example, the acceleration voltage is required in a range from about 1 to 35 KeV.

Meanwhile, materials and thicknesses of resist films on which an EB cure treatment is performed are various and if the electron beams (EB) emitted by the acceleration voltage described above are irradiated on a resist film, the electron beams (EB) may penetrate through the resist film and be irradiated on a lower layer thereof depending on the kind of resist film. As a result, an undesired treatment can be performed on the corresponding lower layer, whereby a property of a device or an insulation film installed in the lower layer may be changed.

Further, the electron beams (EB) may interact with a constituent material of the irradiation window 6b while penetrating through same and with the gas molecules inside the vacuum chamber 1 after penetrating through the irradiation window 6b. As a result, energy distribution thereof becomes broad and energy of the electron beams (EB) becomes uneven, so that accuracy of the treatment may get deteriorated.

Figure 13:
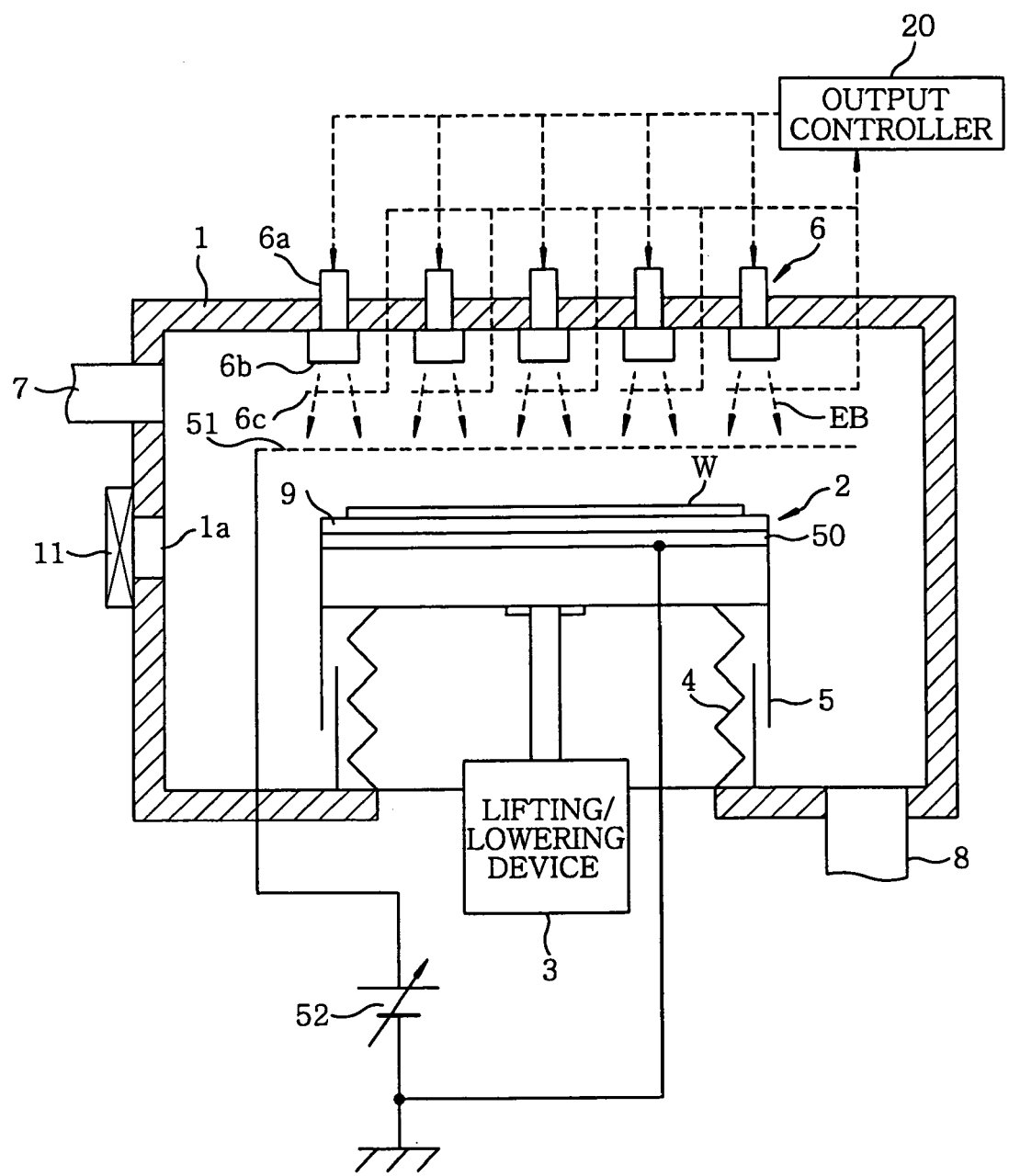
FIG. 13 presents a schematic configuration in accordance with still another preferred embodiment of a surface treating device of the present invention.

FIG. 13 shows a configuration of a preferred embodiment having an energy control unit for controlling energy of the electron beam (EB) described above. As shown in the same drawing, an electrode 50 is installed on the mounting table 2, and a middle electrode 51 is installed between the mounting table 2 and the electron beam irradiation mechanism 6.

The middle electrode 51 is made of, e.g., stainless, aluminum, or the like and formed of a meshed or a perforated shape so as to allow for the electron beams (EB) to pass through. In addition, a DC power source 52 is coupled to the middle electrode 51, and formed to apply a desired DC voltage to the middle electrode 51. Meanwhile, the electrode 50 installed on the mounting table 2 is grounded in an example described in FIG. 13.

Figure 14:
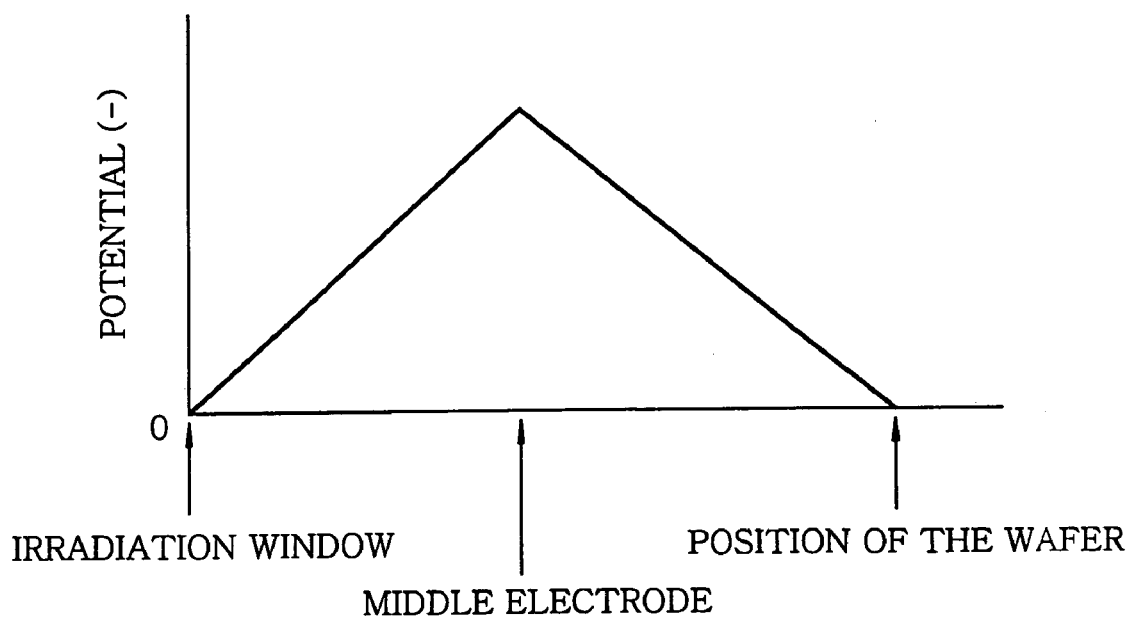
FIG. 14 provides an electric field condition in the surface treating device of FIG. 13.

Further, if a desired negative voltage (for example, −2 to −13 KV) is applied to the middle electrode 51 from the DC power source 52, an electric field is to be formed in such a way that a magnitude (absolute value) of the negative voltage becomes a maximum in a part of the middle electrode 51 and it becomes zero in parts of the irradiation window 6b and the semiconductor wafer w [electrode 50], as shown in FIG. 14.

As a result, it can be configured such that electrons of low energy in the electron beams (EB) emitted from the irradiation window 6b of each EB tube 6a, which cannot pass through the middle electrode 51, are eliminated and filtered electron beams (EB) can be irradiated to the semiconductor wafer W.

Further, in case where the electrode 50 is grounded, the electron beams (EB) passing through the middle electrode 51 are accelerated up to thereby gain original energy by a potential difference between the middle electrode 51 and the semiconductor wafer W (electrode 50). However, by reducing the potential difference between the middle electrode 51 and the semiconductor wafer W (electrode 50), electron beam (EB) energy can be lowered. Here, the acceleration voltage in the EB tube 6a is, e.g., in a range from about 1 to 35 KeV.

In accordance with the preferred embodiment mentioned above, electrons of low energy in the electron beams (EB) whose energy distributions are broadened by interactions with the irradiation window 6b when passing through same and by interactions with the gas molecules inside the vacuum chamber 1 after passing through the irradiation window 6b are eliminated, and the electron beams (EB) of narrow and even energy distribution can be irradiated to the semiconductor wafer W.

In other words, the middle electrode 51 and the DC power source 52 function as an electronic energy filtering device for eliminating electrons having undesired energies in the electron beams (EB).

As mentioned above, by irradiating the electron beams (EB) of a narrow and even energy distribution to the semiconductor wafer W, it is possible to accurately perform a uniform surface treatment on a resist film or the like formed on the semiconductor wafer W in a desired depth region. In addition, as described above, the electron beam (EB) can be controlled by controlling an output of the DC power source 52. As a result, it is possible to accurately perform a surface treatment by controlling the DC power source 52 depending on a surface condition of the resist film or a progress condition of the treatment.

Figure 15:
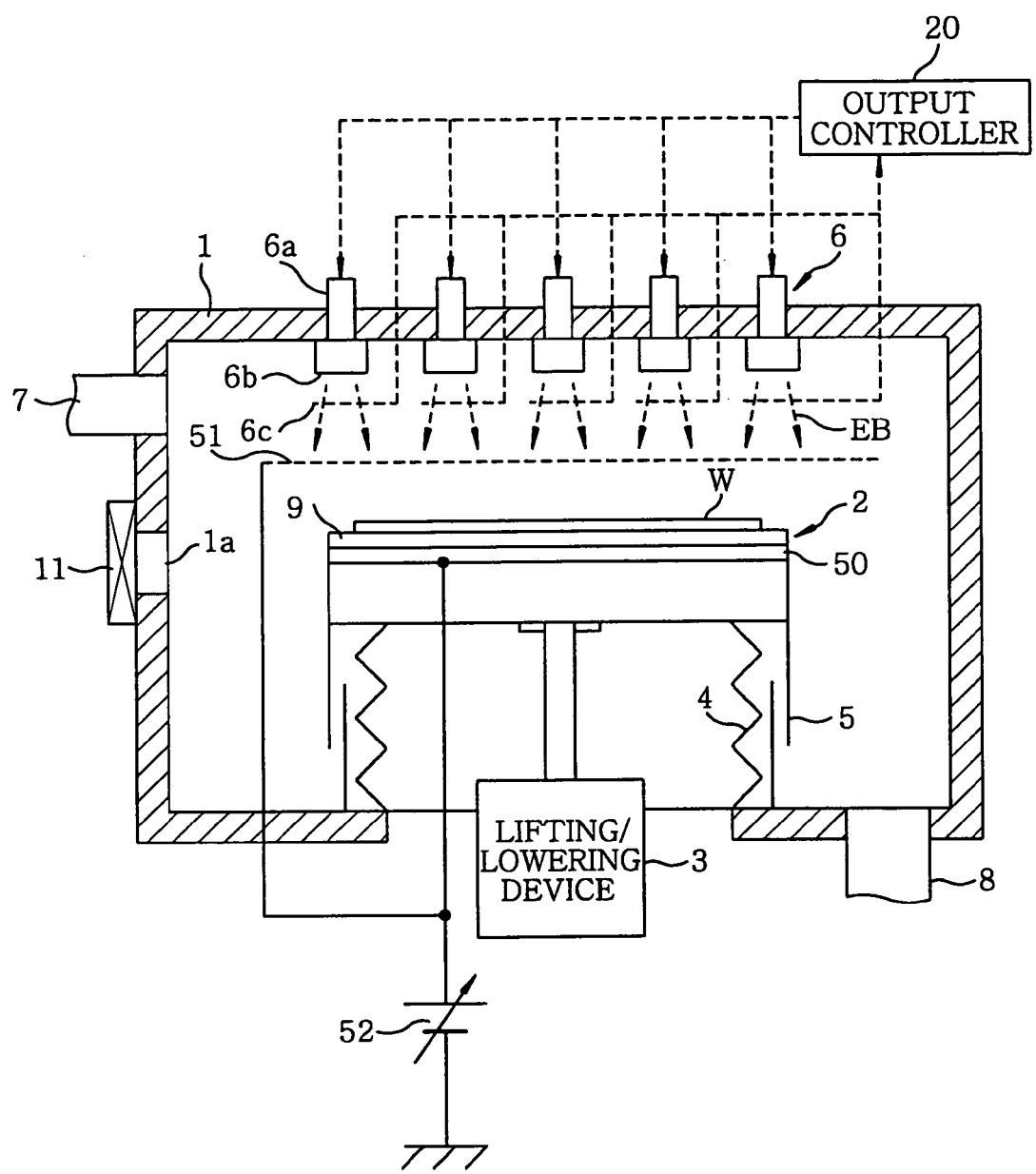
FIG. 15 offers a schematic configuration in accordance with still another preferred embodiment of a surface treating device of the present invention.
Figure 16:
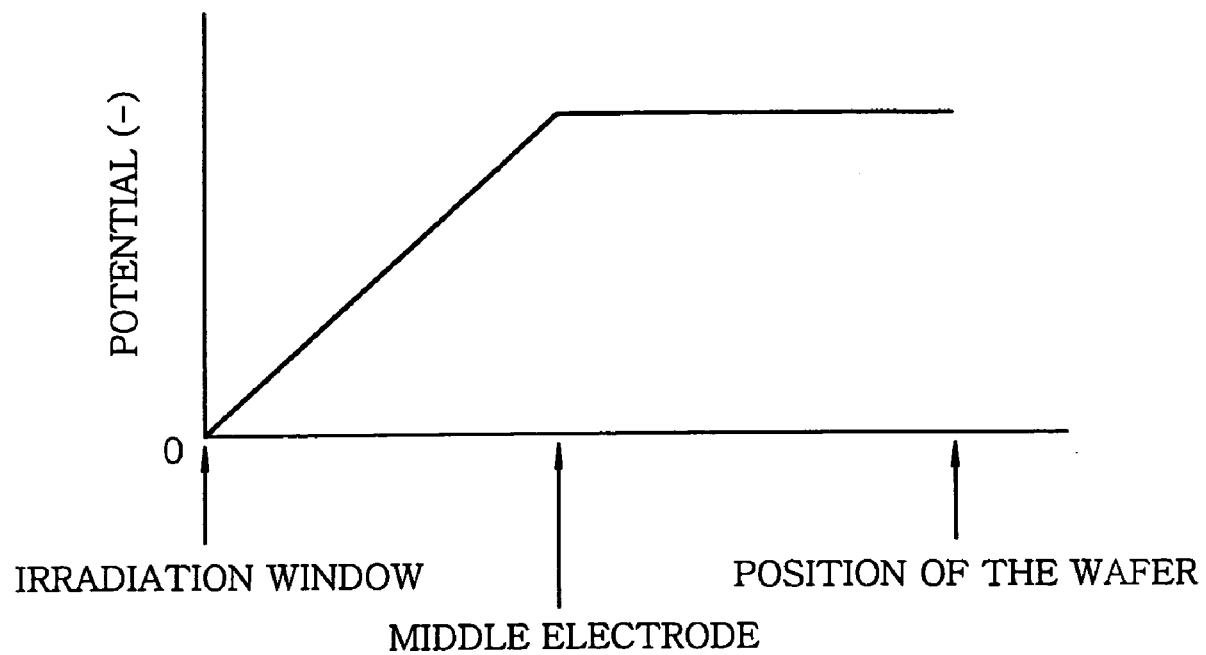
FIG. 16 illustrates a view for showing an electric field condition in the surface treating device of FIG. 15.

FIG. 15 describes a configuration of another preferred embodiment. In this embodiment, the aforementioned middle electrode 51 and the electrode 50 are coupled to the DC power source 52. As shown in FIG. 16, the middle electrode 51 and the electrode 50 have an identical potential, so that an electric field having a space where there is no potential difference can be formed between the middle electrode 51 and the semiconductor wafer W (electrode 50).

In accordance with the preferred embodiment shown in FIGS. 15 and 16, same as the aforementioned embodiment, electrons of low energy, which are not able to pass through the middle electrode 51, are eliminated, and filtered electron beams (EB) can be irradiated to the semiconductor wafer W, wherein the electron beams (EB) are irradiated to the semiconductor wafer W in a state where energy thereof becomes low as a whole.

As a result, the electron beam (EB) having lower energy than the lowest acceleration voltage (e.g., about 15 KeV), which is required for the EB tube 6a, can be irradiated to the semiconductor wafer W. Therefore, even in case where a resist film on which an EB cure treatment is to be performed is thin, it is possible to prevent the electron beams (EB) from reaching a device, an insulation film, or the like of a lower layer in the resist film, whereby undesired treatment in the lower layer can be prevented.

Figure 17:
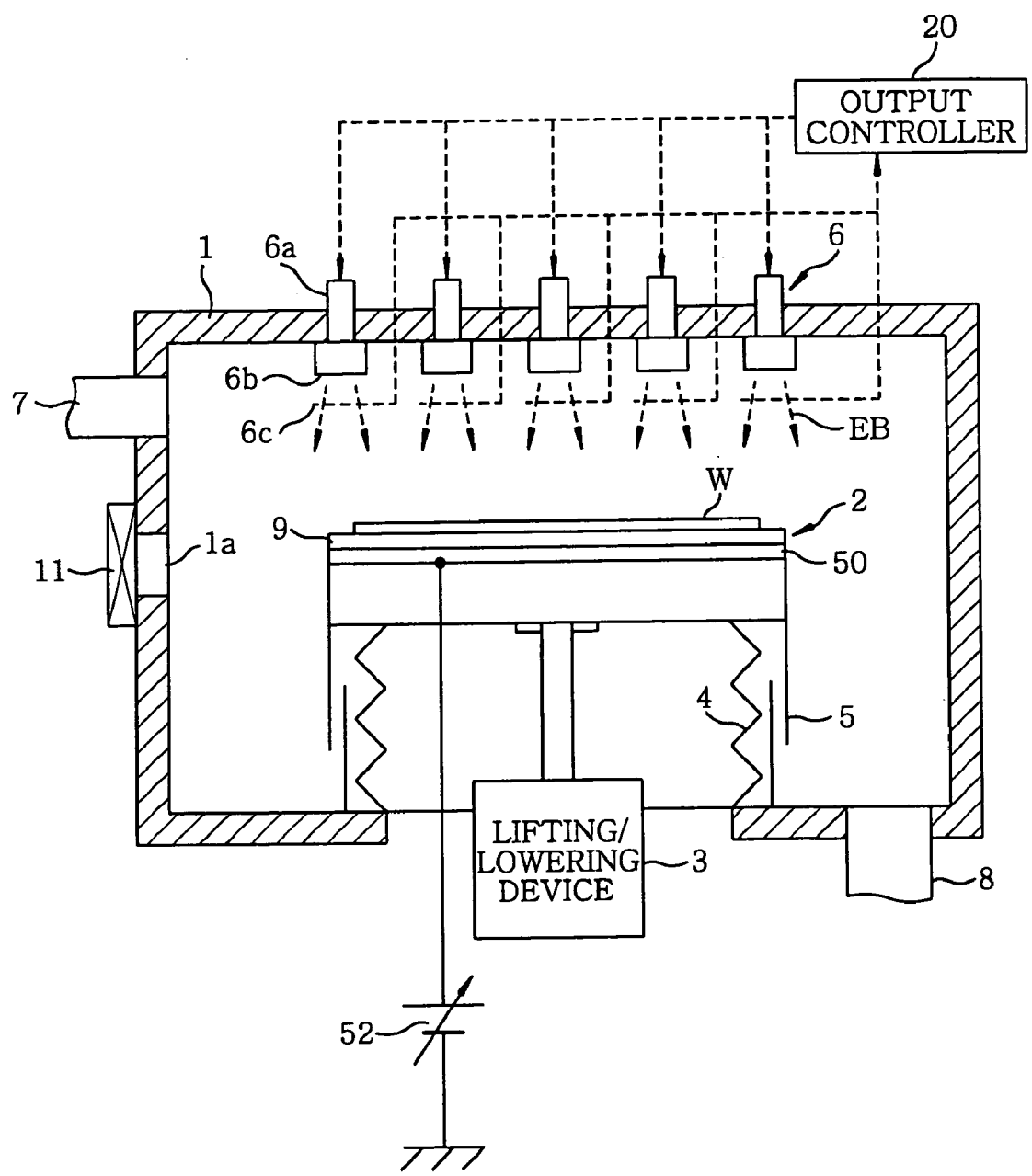
FIG. 17 represents a schematic configuration in accordance with still another preferred embodiment of a surface treating device of the present invention.
Figure 18:
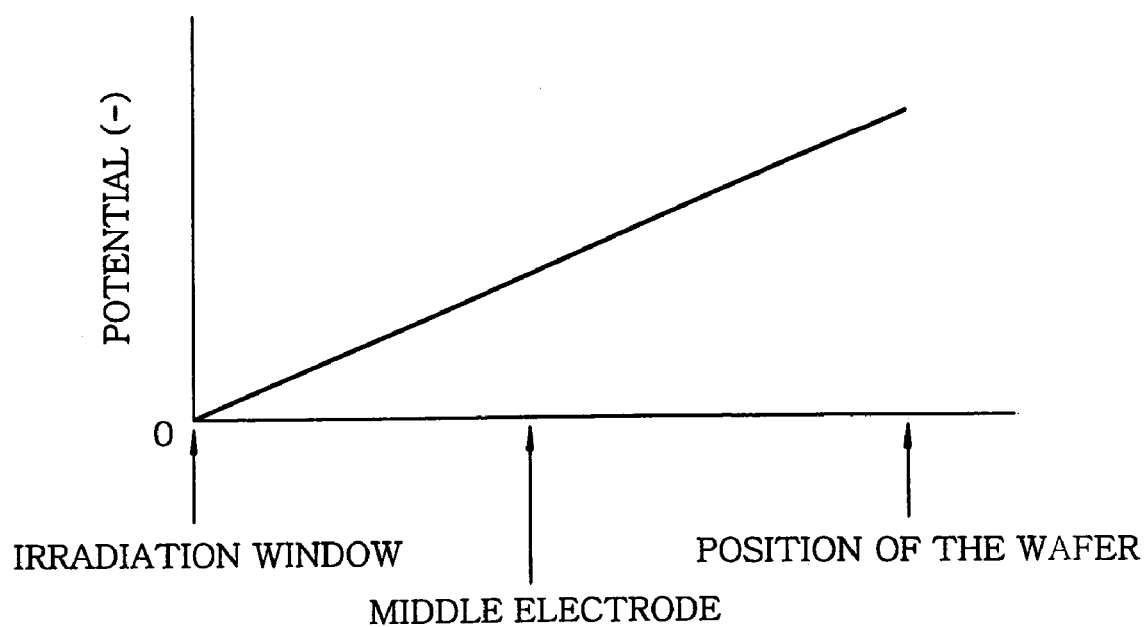
FIG. 18 shows an electric field condition in the surface treating device of FIG. 17.

FIG. 17 shows a configuration of another preferred embodiment. In this embodiment, the electrode 50 is coupled to the DC power source 52 without using the aforementioned middle electrode 51, and the electron beam (EB) energy is controlled by the electrode 50 only. As shown in FIG. 18, an electric field where a potential varies linearly can be formed from the irradiation window 6b to the semiconductor wafer W (electrode 50).

In accordance with the preferred embodiment having such a configuration, electrons of low energy, which are not able to pass through the middle electrode 51, are eliminated, and filtered electron beams (EB) can be irradiated to the semiconductor wafer W, wherein the electron beams (EB) are irradiated to the semiconductor wafer W in a state where energy thereof becomes low as a whole. Therefore, the same effect can be obtained, as the aforementioned embodiment.

Further, depending on the case, energy of the electron beam (EB) irradiated to the semiconductor wafer W may be controlled to be changed by varying an applied voltage from the DC power source 52 during the treatment. Still further, for a uniform treatment of, e.g., a resist film over a somewhat thick range, the electron beam (EB) energy can be controlled to be periodically changed by periodically varying the applied voltage from the DC power source.

Still further, in a case of controlling the electron beam (EB) by an electric field, it is not limited to the electrode 50 or the middle electrode 51 described above. For example, in a case of installing, e.g., a baffle plate for exhausting a sidewall part or a bottom part of the vacuum chamber 1, or a periphery of the mounting table 2, the electron beam (EB) can be controlled by applying the voltage to the baffle plate or the like.

As mentioned above, each of the preferred embodiments has such a configuration that the EB tube 6a forming the electron beam irradiation mechanism 6 has the window (irradiation window) 6b. However, when performing a reforming by irradiating the electron beams (EB) to the semiconductor wafer W, various substances such as moisture and the like are evaporated from the resist and attached to the window 6b, whereby the window 6b may possibly be obscured. Thus, conventionally, there has been performed so-called soft bake for evaporating the moisture at a low temperature (e.g., 200° C. or the like) compared with a surface treatment temperature before performing the surface treatment.

However, since the surface treatment is performed at a high temperature (e.g., 350° C.) as compared with the soft bake, plenty of moisture can be generated and attached to the window 6b, thereby obscuring the window 6b. As a result, cleaning of the window 6b should be performed very often. Therefore, it is preferable that a heat treatment (pre-bake) is performed at a high temperature (e.g., the same temperature as that of the surface treatment) as compared with the soft bake, prior to the surface treatment.

Figure 19:
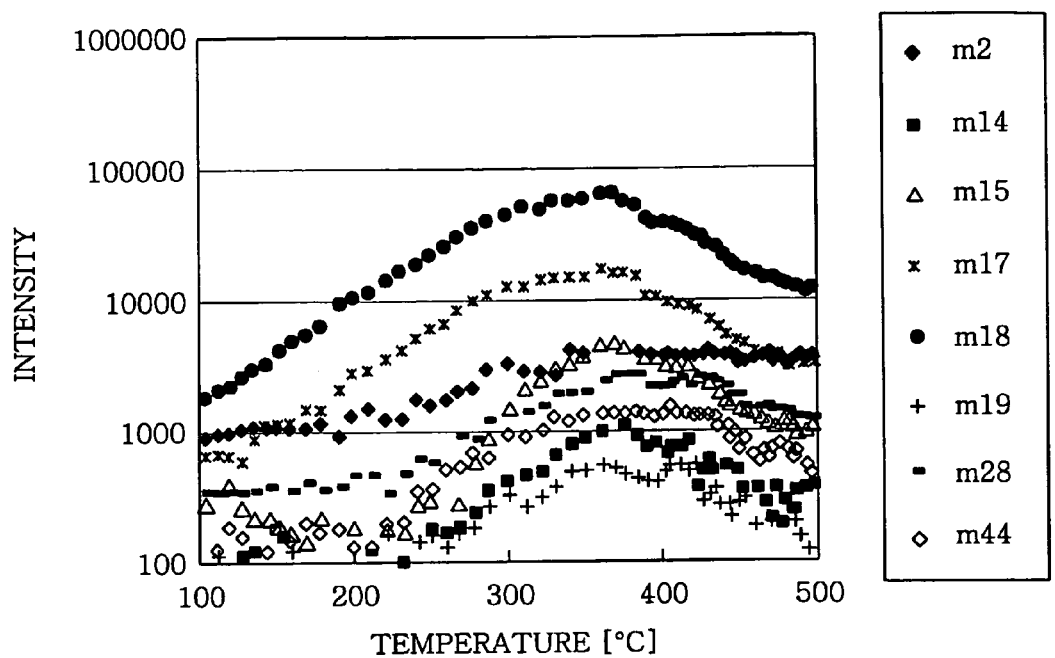
FIG. 19 sets forth a view for showing an amount of substances formed in a case of only performing a soft bake.
Figure 20:
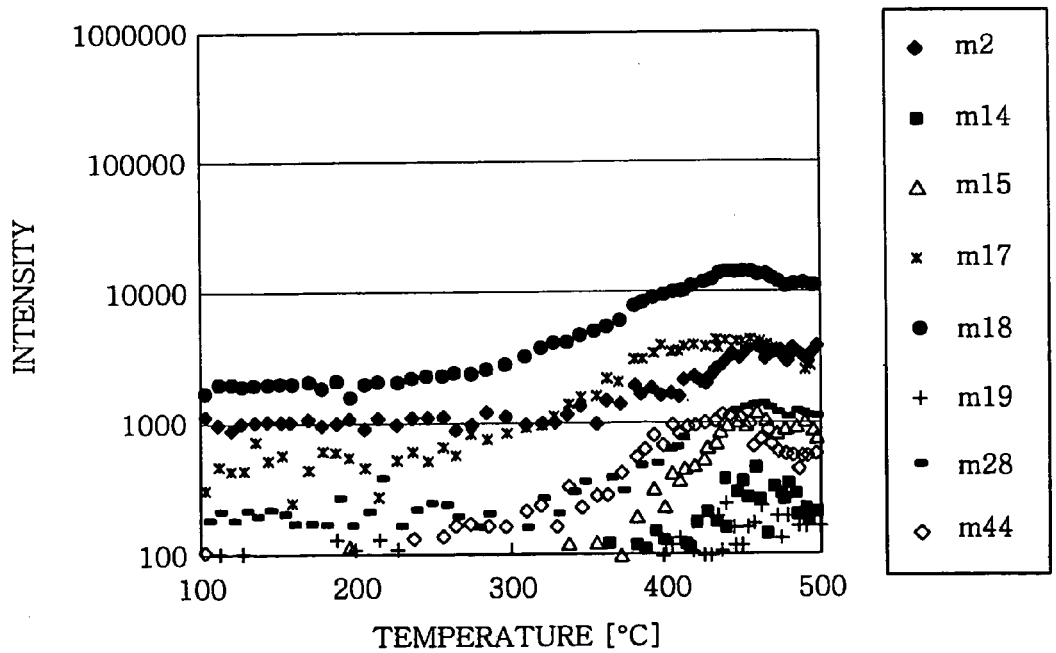
FIG. 20 shows an amount of substances formed in a case of only performing a pre-bake.

FIGS. 19 and 20 show results for investigating the amount of substances generated in such cases that the semiconductor wafer W subjected to a soft bake only is heated (FIG. 19) and the semiconductor wafer W, on which a heat treatment (pre-bake) is performed at 350° C. for 1 minute by a hot plate in addition to the soft bake, is heated (FIG. 20), wherein a vertical axis and a horizontal axis indicate intensity and temperature, respectively.

Further, in these graphs, the result shown by circles placed on a top portion describes m18=$H_2O$, i.e., moisture. Still further, for another substances, m2=$H_2$, m14=N, $CH_2$, m15=$CH_3$, NH, m17=OH, $NH_3$, m19=F, m28=$N_2$, $C_2H_4$, CO, m44=$C_3H_8$, $CO_2$, and $N_2O$.

As shown in FIGS. 19 and 20, in a case (FIG. 20) of the semiconductor wafer W subjected to a pre-bake for 1 minute by a hot plate in addition to the soft bake, the amount of moisture generated by heating can be reduced considerably, as compared with the case (FIG. 19) of the semiconductor wafer W subjected to a soft bake only.

Accordingly, by performing the pre-bake mentioned above, obscuring the window 6b can be suppressed.

Figure 21:
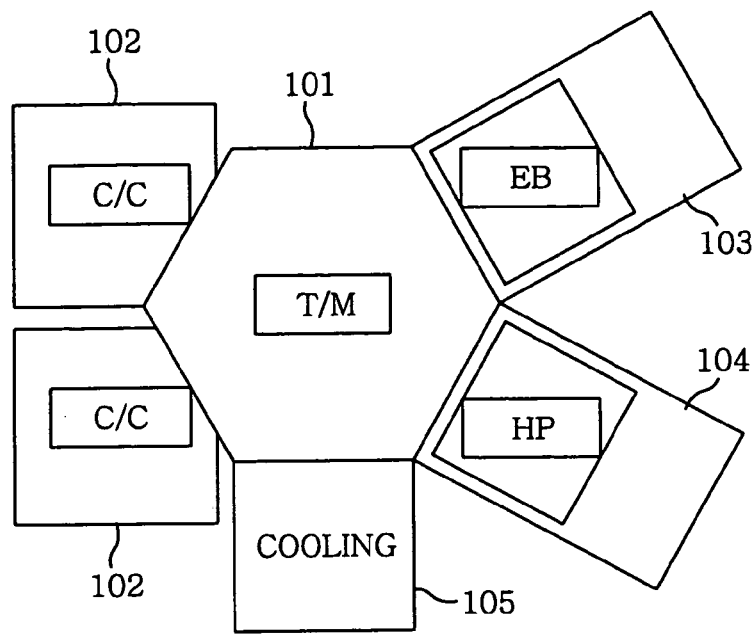
FIG. 21 describes an exemplary configuration of a device for performing a pre-bake.

FIG. 21 shows an exemplary configuration of a device having a tool for performing the pre-bake. The device described in the same drawing includes two cassette chambers (C/C) 102, a surface treating device (EB) 103, a heating treatment device (HP) 104, and a cooling device (Cooling) 105, which are installed around a transfer module (T/M) 101. Insides of these devices are formed to be set under a predetermined vacuum atmosphere. In addition, the semiconductor wafer W is taken out from the cassette chamber placed inside the cassette chamber 102, and sequentially transferred to the heating treatment device (HP) 104, surface treating device (EB) 103, and cooling device 105, by a transfer mechanism disposed in the transfer module (T/M) 101. Thereby, heat treatment (pre-bake), surface treatment by an irradiation of the electron beam (EB), and cooling treatment are performed sequentially.

By using the device having such a configuration, the pre-bake, surface treatment by an irradiation of the electron beam (EB), and cooling treatment can be performed efficiently inside one device. In addition, by performing the pre-back by using the heating treatment device (HP) 104 before performing the surface treatment with the surface treating device (EB) 103, the obscuring can be suppressed in the window 6b of the surface treating device (EB) 103.

Figure 22:
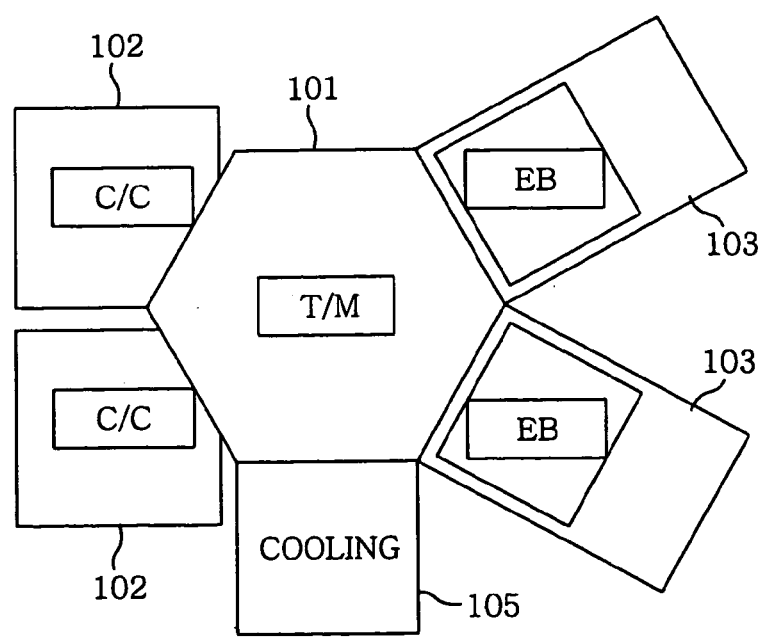
FIG. 22 provides an exemplary configuration of a device for performing a pre-bake.

Further, as described above, a series of treatments can be performed similarly, in a device having such a configuration that two surface treating devices (EB) 103 are installed without a single-purpose heating treatment device (HP) 104, as shown in FIG. 22. In this case, after loading the semiconductor wafer W into the surface treating device (EB), a pre-bake is performed on the semiconductor wafer W while letting large quantities of inert gases, e.g., nitrogen and the like, flow into the surface treating device (EB) 103. Subsequently, a surface treatment for irradiating the electron beams (EB) is performed by decreasing a mass flow of the gas to a level needed for a common surface treatment. Even in this case, the obscuring can be suppressed in the window 6b of the surface treating device (EB) 103, since large quantities of moistures generated during the pre-bake can be extracted to the outside by a gas flow.

Figure 23:
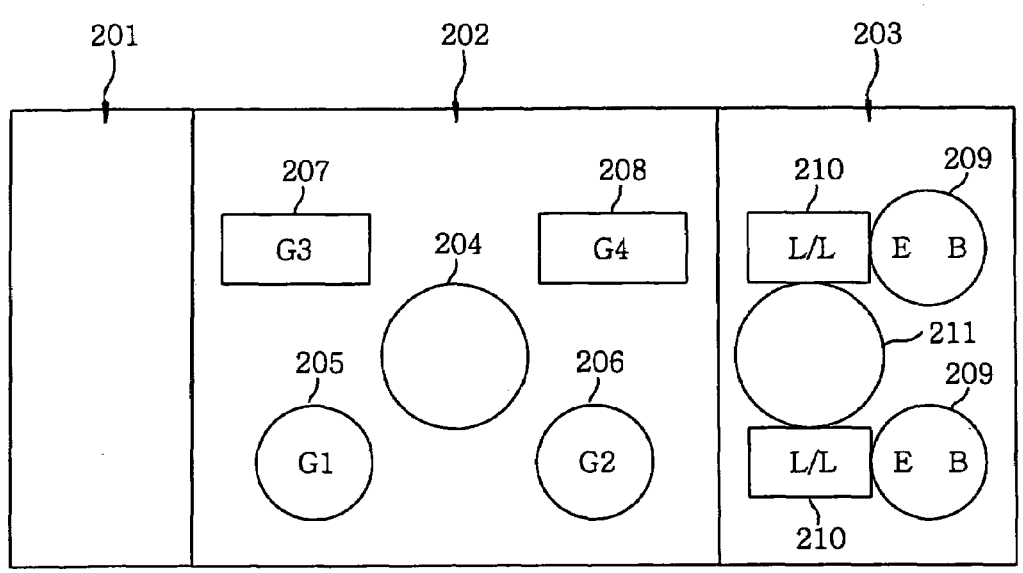
FIG. 23 depicts an exemplary configuration of a device for performing a pre-bake.
Figure 24:
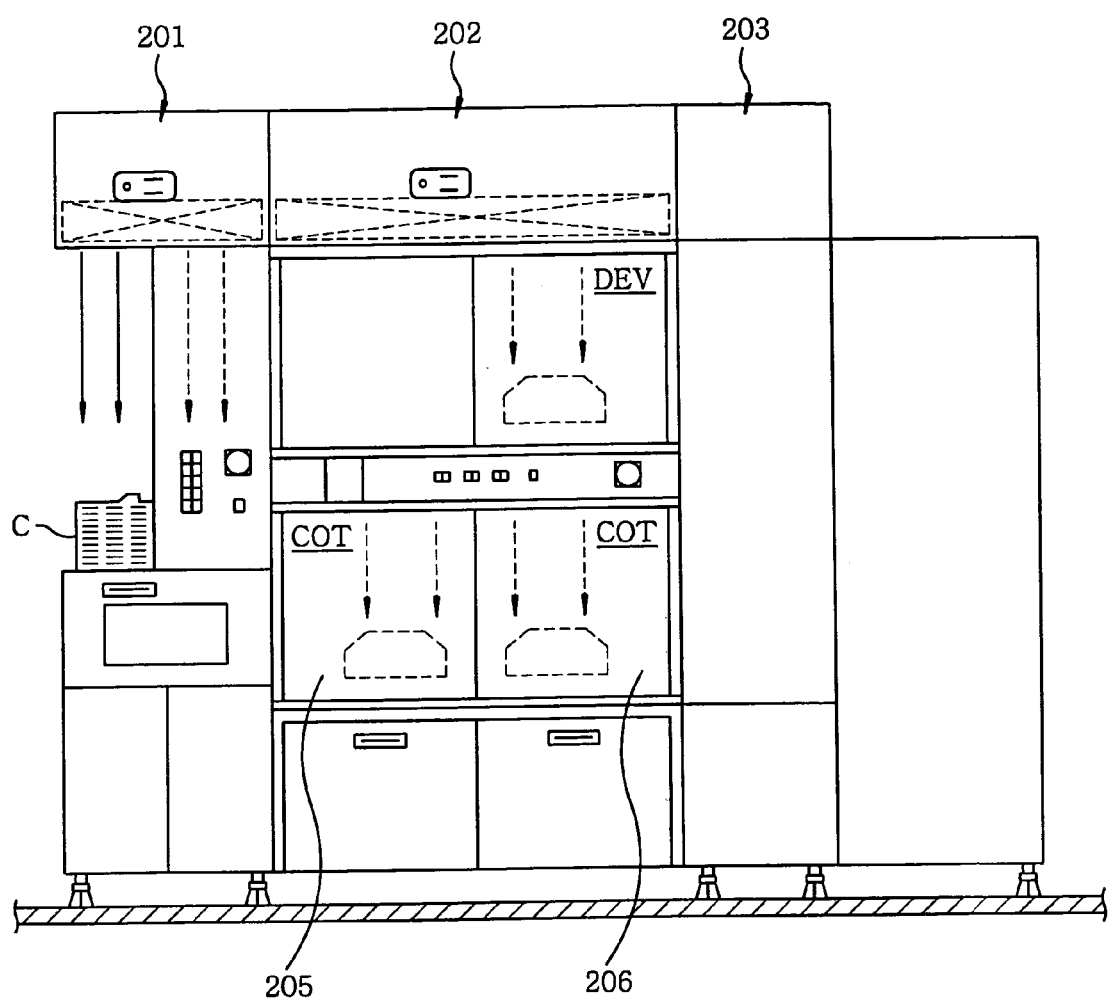
FIG. 24 offers an exemplary configuration of a device for performing a pre-bake.
Figure 25:
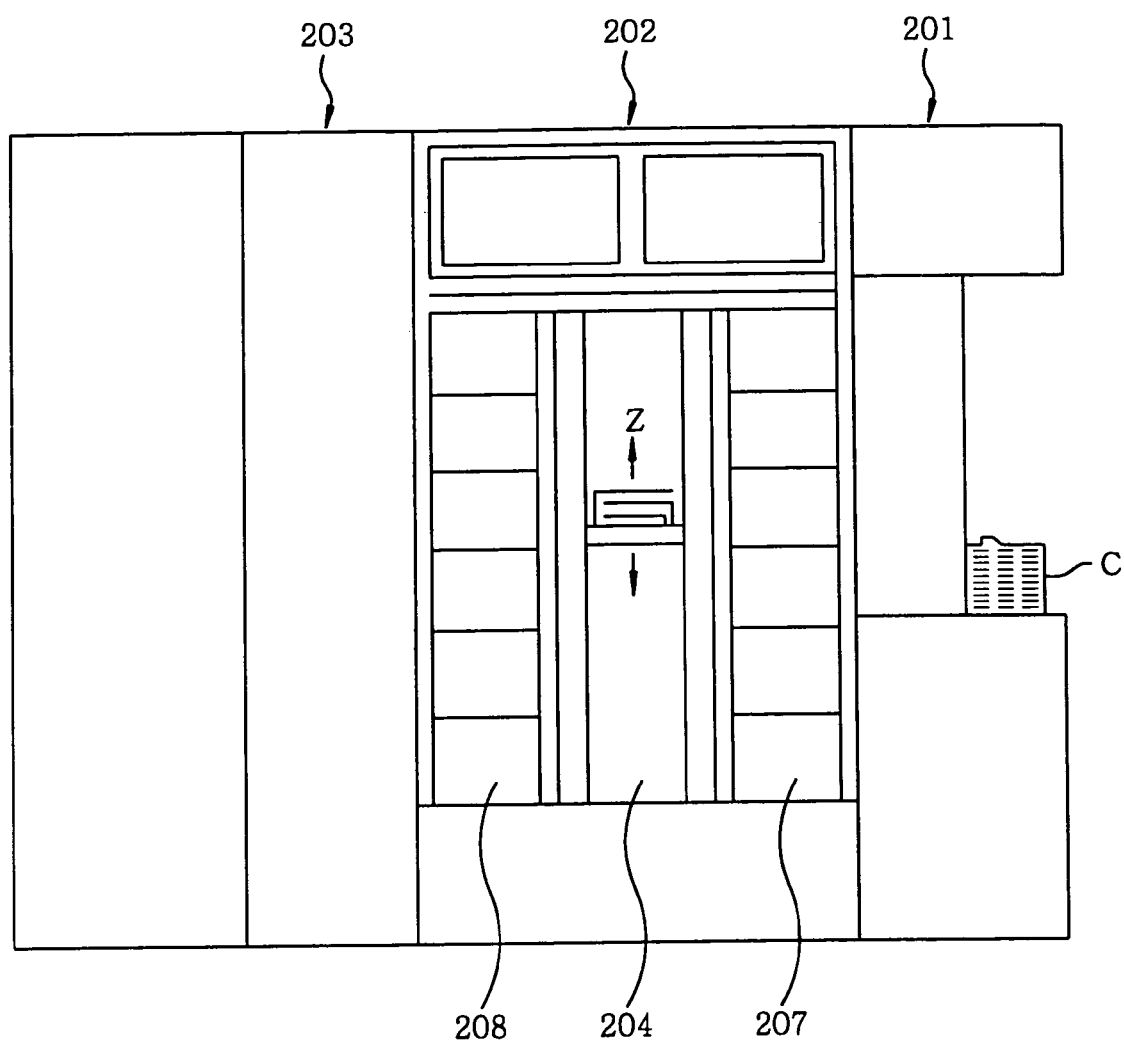
FIG. 25 presents an exemplary configuration of a device for performing a pre-bake.

Further, FIGS. 23 to 25 describe examples of a device which combines the surface treating device with a coating and developing device for performing a coating and a development of a resist and also performs a pre-bake of the semiconductor wafer W by, e.g., a heating tool of the coating and developing device.

As shown in these drawings, in the device, there are coupled and formed a cassette station 201, a coating and developing unit 202 for performing a coating and a development of a resist and an accompanying heat treatment, and the like, and a surface treating unit 203 in which the aforementioned surface treating device is installed, as a single body. Further, in this device, an exposure device (not shown) for performing an exposure of a predetermined circuit pattern for the resist coated on the semiconductor wafer W is coupled and employed.

In the cassette station 201, a transfer mechanism (not shown) is installed and formed to transfer the semiconductor wafer W between the cassette C installed in the cassette station 201 and the coating and developing unit 202.

Further, as shown in FIG. 23, in the coating and developing unit 202, there is installed a transfer mechanism 204 capable of vertically and horizontally transferring the semiconductor wafer W, in the central part. Around the transfer mechanism 204, there are disposed four processing unit sets in which treatment units are installed in a multistage, i.e., a first processing unit set G1 205, a second processing unit set G2 206, a third processing unit set G3 207, and a fourth processing unit set G4 208. The transfer mechanism 204 is formed to load and unload the semiconductor wafer W for each treatment unit disposed in these processing unit sets in a multistage. The first processing unit set G1 205 and the second processing unit set G2 206 are formed of a resist coating unit (COT) for coating a resist solution on the semiconductor wafer, a developing treatment unit (DEV) for performing a developing treatment on the semiconductor wafer W, and the like.

Still further, the third processing unit set G3 207 and the fourth processing unit set G4 208 are formed of a cooling unit for cooling the semiconductor wafer W, a receiving and delivering unit for performing loading and unloading of the semiconductor wafer W, an adhesion unit for performing an adhesion treatment for enhancing adhesiveness of the resist solution, a heating treatment unit for performing a heat treatment on the semiconductor wafer W, and the like. Still further, in a certain position out of the third processing unit set G3 207 and the fourth processing unit set G4 208, there are placed a heat treatment unit for performing a soft baking on the semiconductor wafer W and a heat treatment unit for performing a pre-bake on the semiconductor wafer W.

Still further, in the surface treating unit 203, there are disposed two surface treating devices (EB) 209, and load-lock chambers (L/L) 210 are installed therein, respectively. In addition, the semiconductor wafer W is formed to be transferred between the coating and developing unit 202 and the load-lock chamber (L/L) 210 by the transfer mechanism 211.

Still further, as described above, there may be installed a heat treatment device for performing a pre-bake on the semiconductor wafer W in the load-lock chamber (L/L) 210, instead of installing a heat treatment device (heat treatment unit) for performing a pre-bake on the semiconductor wafer W in the coating and developing unit 202.

By employing the device having such a configuration, coating and developing treatment, heat treatments (soft bake and pre-bake), surface treatment by an irradiation of electron beams (EB), and cooling treatment can be performed efficiently by a single device. In addition, developing of the obscuring can be suppressed in the window 6b of the surface treating device (EB) 209 by performing a pre-bake before performing a surface treatment by the surface treating device (EB) 209.

Next, it will be explained a structure of an attachment part of the aforementioned temperature detector 10 shown in FIG. 1.

Figure 26:
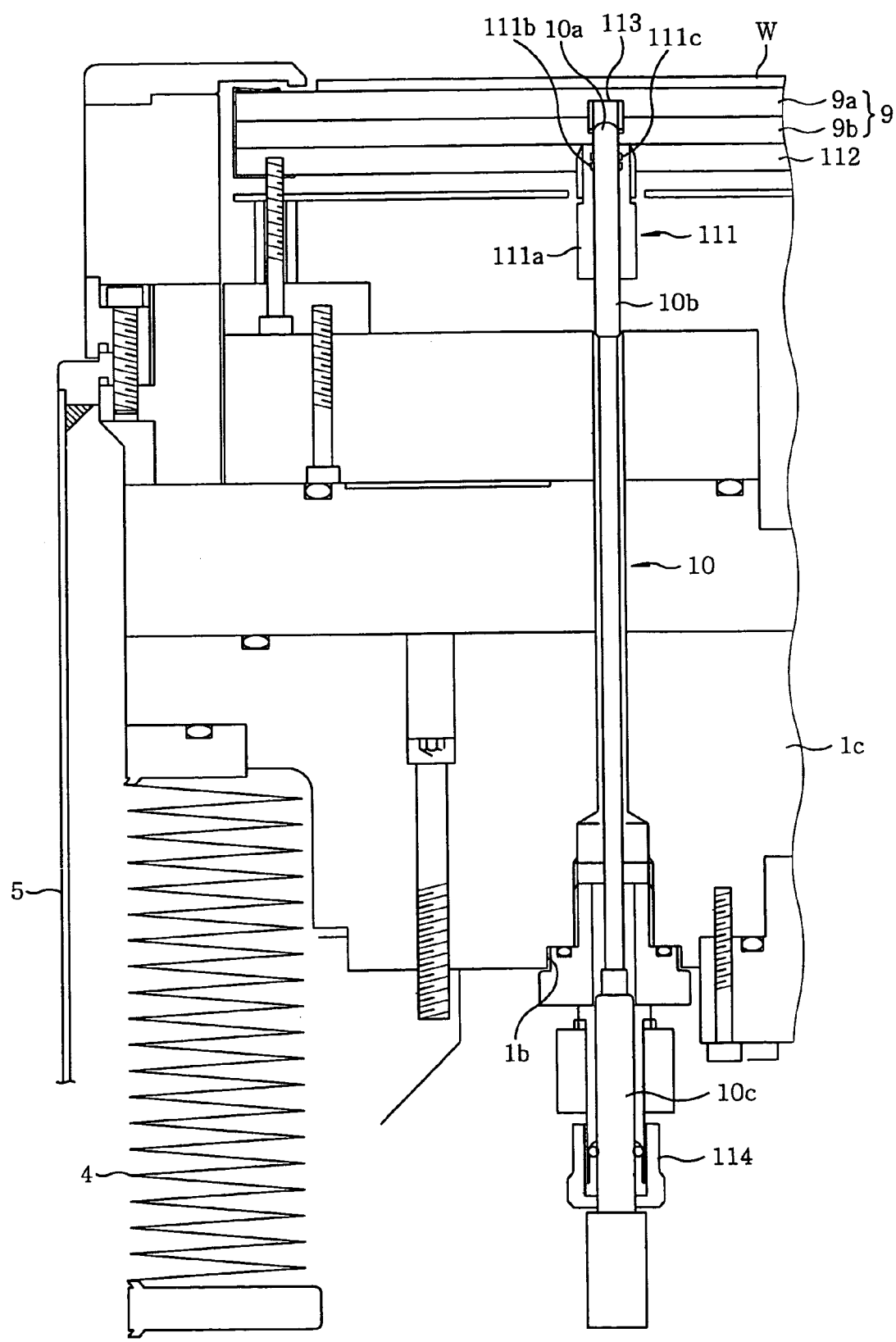
FIG. 26 is a schematic configuration of a main part in the surface treating device of FIG. 1.

As shown in FIG. 26, the temperature detector 10 is formed of a bar shape and, in an end portion thereof, there is installed a thermometric temperature sensor unit 10a. The temperature sensor unit 10a is made of a thermometric resistance including, e.g., Pt and the like, and an outside the thermometric resistance is covered with a protection tube 10b whose material is made of stainless steel and the like. Further, in a latter part of the temperature detector 10, there is installed a sleeve 10c whose material is made of, e.g., stainless steel, and an airtight sealing is performed in the sleeve 10c part.

Still further, a holder mechanism 111 is installed correspondingly to the temperature detector 10 so as to form a recess into which the temperature sensor unit 10a of the temperature detector 10 is inserted.

Figure 27:
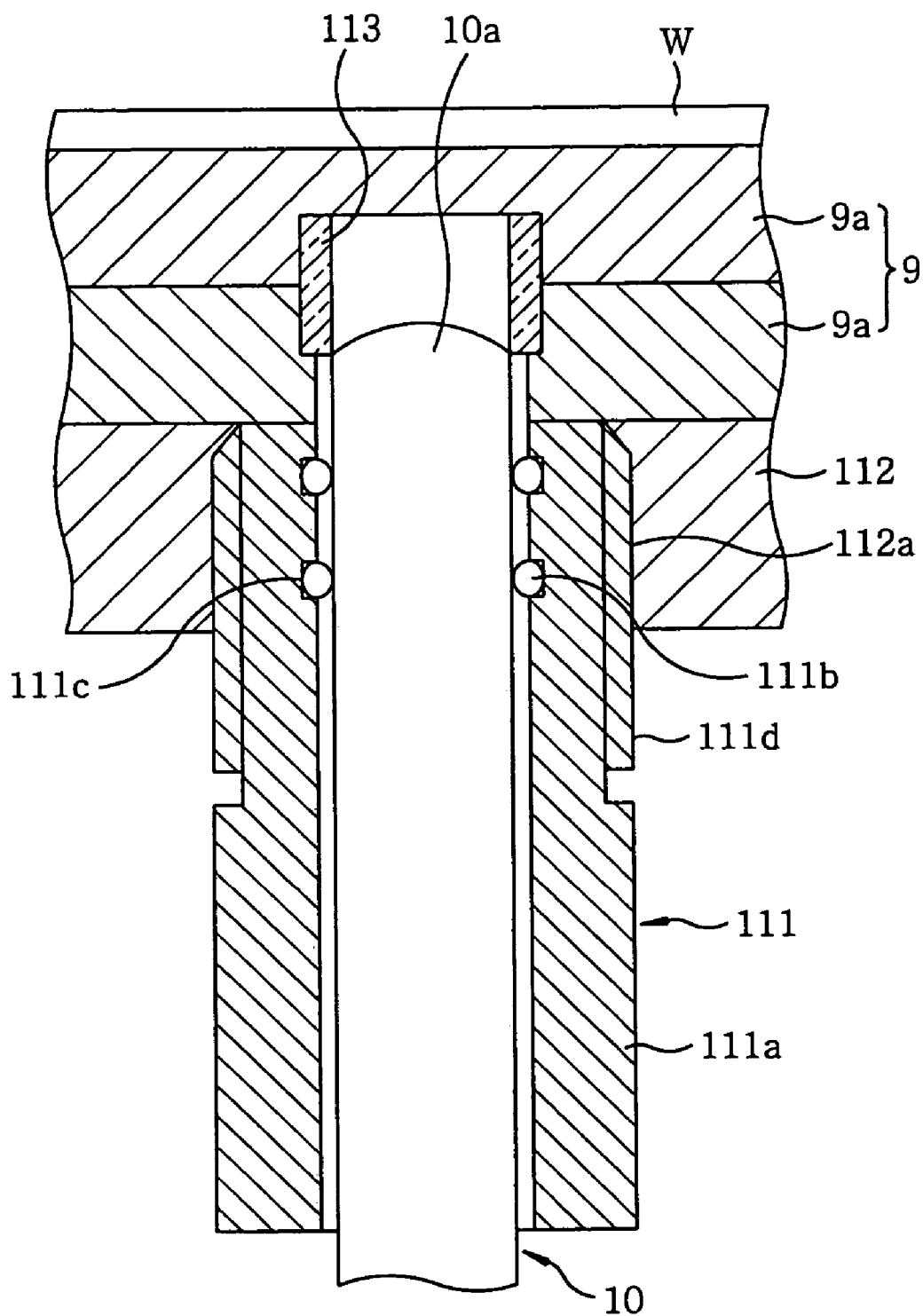
FIG. 27 shows a schematic configuration of a main part in the surface treating device of FIG. 1.

As shown in FIG. 27, the holder mechanism 111 is formed of a cylindrical holder unit 111a into which the temperature sensor unit 10a is inserted, and an elastic member, which is installed inside the holder unit 111a and makes contact with the temperature sensor unit 10a to be engaged elastically, and, at the same time, conducts heat between the holder unit 111a and the temperature sensor unit 10a.

The holder unit 111a is made of a material in which excellent heat conduction can be performed, e.g., metal, ceramic, and the like. In the present embodiment, the holder unit 111a is made of an alumina ceramics whose purity is 99% or more. In addition, the holder unit 111a is fixed to a heat supporting plate 112, which is made of an alumina ceramics, and installed under two heater plates 9a and 9b forming a heater 9.

Such holder unit 111a and the heat supporting plate 112 need to be fixed so that heat conduction is performed excellently therebetween. Accordingly, in the present embodiment, the holder unit 111a and the heat supporting plate 112 are formed to be fixed strongly by tightening a screw 111d formed in an outer part of the end portion of the holder part 111a to a screw 112a installed in an opening of the heater supporting plate 112.

Figure 28:
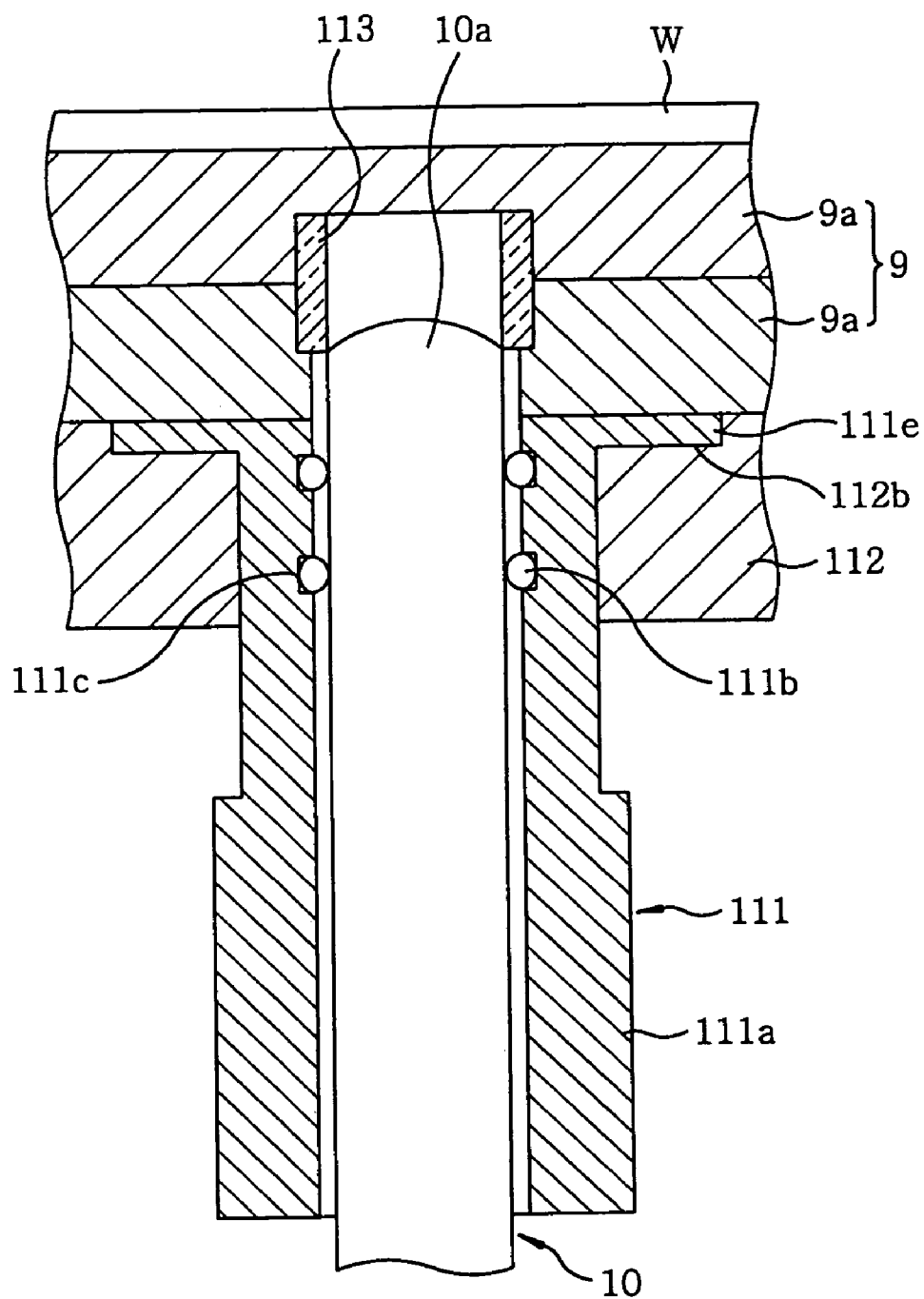
FIG. 28 sets forth a view for showing another exemplary configuration of FIG. 27.

However, a configuration of a fixing part between the holder part 111a and the heater supporting plate 112 is not limited thereto and it may be another structure and modified variously as long as the heat conduction is performed well therebetween. For example, as shown in FIG. 28, such a configuration may be employed that a flange portion 111e is installed in the end portion of the holder unit 111a to be accommodated in the recess 112b, which is installed in the heater supporting plate 112, and inserted between the heater supporting plate 112 and the heater plate 9b, to thereby increase a contact area therebetween and facilitate heat conduction.

Still further, the elastic member 111b is made of a material, in which heat conduction is performed well, e.g., stainless steel, and the like. In the present embodiment, an elastic member [contact CSC100·CSC104 series (brand name) (NBS made)] having such a shape (outer diameter Φ5 mm, inner diameter Φ4 mm) that a coil spring shaped member is formed as an O ring shape. In addition, such an elastic member on the market is employed for obtaining a common electric contact.

Meanwhile, the elastic members 111b are placed inside two ring-shaped grooves 111c formed in the holder unit 111a at a predetermined distance (in the present embodiment, 0.86 mm), respectively. By the elastic members 111b, the temperature sensor unit 10a of the temperature detector 10 is elastically engaged, and, at the same time, heat conduction is performed excellently between the holder unit 111a and the temperature sensor unit 10a through the elastic members 111b.

Still further, in the present embodiment, in a portion of the heater 9 having a contact with a head part of the temperature sensor unit 10a, there is installed a cylindrical member 113 whose material is made of a quartz, and a tapered head portion of the temperature sensor unit 10a is inserted a little into the cylindrical member 113 to be engaged.

Substantially, as shown in FIGS. 26 and 1, the temperature detector 10 is formed to be inserted from an atmospheric side (lower side) to the temperature detector attachment port 1b corresponding to an opening installed in a bottom portion plate 1c forming a bottom part of the vacuum chamber 1 such that it can be attached thereto and separated therefrom.

Further, in a state where the temperature detector 10 is installed, the temperature sensor unit 10a of the end side of the temperature detector 10 is inserted into the holder 111a to thereby elastically be engaged. On the other hand, a part of the temperature detector attachment port 1b is substantially formed to airtightly be sealed with the sleeve 10c by a connector (Swagelok made) 114.

By such a configuration, when attaching the temperature detector 10, the temperature sensor unit 10a thereof can be set surely at a predetermined position elastically engaged by the elastic member 111b inside the holder unit 111a. In addition, the condition of heat conduction can be maintained at a constant and good condition.

Thus, the temperature detector 10 can be attached easily by anybody without much experience and everybody can perform stable and accurate temperature detection.

Meanwhile, a temperature detection signal by the temperature detector 10 is inputted to the temperature controller 15 which compares the temperature detection signal with a predetermined set temperature to thereby adjust powers supplying into the heater 9. As a result, temperature control is performed such that the heater 9 comes to have a predetermined set temperature. Therefore, the temperature of the heater 9 is controlled to be set at a predetermined temperature from the fact that stable and accurate temperature detection can be performed by the temperature detector 10, whereby excellent and stable treatment can be performed on the semiconductor wafer W, while maintaining the semiconductor wafer W at a predetermined temperature, accurately.

As described above, in the mounting table 2, there is installed the holder mechanism 111 having the holder unit 111a forming the recess into which the temperature sensor unit 10a of the end portion of the temperature detector 10 is inserted; and the elastic member 111b, which is installed in the holder unit 111a, contacted with the temperature sensor unit 10a to elastically engage same, and, at the same time, conducts heat between the holder unit 111a and the temperature sensor unit 10a. Therefore, attachment of the temperature detector 10 can be easily performed, and excellent treatment can be stably performed by performing stable temperature detection, accurately.

Further, in the preferred embodiment, it was explained that the present invention is applied to the surface treating device for performing a surface treatment of, e.g., semiconductor wafer, but the present invention is not limited thereto. For example, the present invention may be applied to a surface treatment of a glass substrate for liquid crystal display device other than the semiconductor wafer, similarly.

While the invention has been shown and described with respect to the preferred embodiment, it will be understood by those skilled in the art that various changes and modifications may be made without departing from the spirit and scope of the invention as defined in the following claims.

What is claimed is:

1. A surface treating device, comprising:
   a vacuum chamber to be set at a specific vacuum atmosphere therein;
   a mounting table installed in the vacuum chamber, on which a substrate to be treated is mounted;
   an electron beam irradiation mechanism for irradiating electrons to the substrate to be treated; and
   an electron path control unit for controlling a path of the electrons irradiated from the electron beam irradiation mechanism.

2. The surface treating device of claim 1, further comprising:
   a detector for detecting an amount of the electrons irradiated from the electron beam irradiation mechanism; and
   a controller for controlling the amount of the electrons from the electron beam irradiation mechanism, based on a detection result from the detector.

3. The surface treating device of claim 1, wherein a surface reforming is performed on the substrate to be treated by an electron irradiation from the electron beam irradiation mechanism.

4. A surface treating device, comprising:
   a vacuum chamber to be set at a specific vacuum atmosphere therein;
   a mounting table installed in the vacuum chamber, on which a substrate to be treated is mounted;
   an electron beam irradiation mechanism for irradiating electrons to the substrate to be treated; and
   an electron path control unit for controlling a path of the electrons irradiated from the electron beam irradiation mechanism,
   wherein the electron path control unit includes an electron path deflecting member and controls the path of the electrons by a potential of the electron path deflecting member.

5. The surface treating device of claim 4, further comprising a potential control unit for controlling the potential of the electron path deflecting member.

6. The surface treating device of claim 5, wherein the potential control unit is formed of a variable resister installed between the electron path deflecting member and a ground potential.

7. The surface treating device of claim 5, wherein the potential control unit is formed of a variable DC power supply for applying a DC current to the electron path deflecting member.

8. The surface treating device of claim 1, wherein the electron path control unit is formed of a magnetic field forming unit.

9. The surface treating device of claim 8, wherein the magnetic field forming unit is configured to generate a magnetic field in a direction normal to a surface of the substrate mounted on the mounting table.

10. The surface treating device of claim 8, wherein the magnetic field forming unit is configured to generate a multipole magnetic field along a sidewall of the vacuum chamber to surround the substrate mounted on the mounting table.

11. The surface treating device of claim 10, wherein the magnetic field forming unit is configured to rotate around the vacuum chamber to make the multipole magnetic field rotate.

12. A surface treating device, comprising:
   a vacuum chamber to be set at a specific vacuum atmosphere therein;
   a mounting table installed in the vacuum chamber, on which a substrate to be treated is mounted;
   an electron beam irradiation mechanism for irradiating electrons to the substrate to be treated; and
   an energy control mechanism for irradiating the electrons to the substrate to be treated by controlling energies of electrons irradiated from the electron beam irradiation mechanism,
   wherein the energy control mechanism functions to filter electron energies such that electrons of other than predetermined energies are removed from electrons emitted from the electron beam irradiation mechanism.

13. A surface treating device, comprising:
a vacuum chamber to be set at a specific vacuum atmosphere therein;
a mounting table installed in the vacuum chamber, on which a substrate to be treated is mounted;
an electron beam irradiation mechanism for irradiating electrons to the substrate to be treated; and
an energy control mechanism for irradiating the electrons to the substrate to be treated by controlling energies of electrons irradiated from the electron beam irradiation mechanism,
wherein the energy control mechanism includes an electrode installed in the mounting table.

14. The surface treating device of claim 13, wherein the energy control mechanism includes a voltage applying unit for applying a predetermined voltage to the electrode.

15. A surface treating device, comprising:
a vacuum chamber to be set at a specific vacuum atmosphere therein;
a mounting table installed in the vacuum chamber, on which a substrate to be treated is mounted;
an electron beam irradiation mechanism for irradiating electrons to the substrate to be treated; and
an energy control mechanism for irradiating the electrons to the substrate to be treated by controlling energies of electrons irradiated from the electron beam irradiation mechanism,
wherein the energy control mechanism includes a meshed or perforated middle electrode installed between the mounting table and the electron beam irradiation mechanism.

16. The surface treating device of claim 15, wherein the energy control mechanism includes a voltage applying unit for applying a predetermined voltage to the middle electrode.

17. The surface treating device of claim 1, wherein the electron path control unit deflects the path of the electrons toward circumferential parts of the substrate to improve uniformity of electrons impinging on a surface of the substrate.

* * * * *